US011463795B2

(12) United States Patent
Hoffmann et al.

(10) Patent No.: US 11,463,795 B2
(45) Date of Patent: Oct. 4, 2022

(54) WEARABLE DEVICE WITH AT-EAR CALIBRATION

(71) Applicant: Meta Platforms Technologies, LLC, Menlo Park, CA (US)

(72) Inventors: Pablo Francisco Faundez Hoffmann, Kenmore, WA (US); Sang-Ik Terry Cho, Kirkland, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/709,252

(22) Filed: Dec. 10, 2019

(65) Prior Publication Data
US 2021/0176555 A1    Jun. 10, 2021

(51) Int. Cl.
*H04R 1/10* (2006.01)
*H04R 29/00* (2006.01)
*H04R 3/04* (2006.01)
*G02B 27/01* (2006.01)
*H03G 5/16* (2006.01)
*G02B 27/00* (2006.01)

(52) U.S. Cl.
CPC ....... *H04R 1/1041* (2013.01); *G02B 27/0172* (2013.01); *H03G 5/165* (2013.01); *H04R 3/04* (2013.01); *H04R 29/001* (2013.01); *G02B 27/0093* (2013.01); *G02B 2027/0138* (2013.01); *G02B 2027/0178* (2013.01)

(58) Field of Classification Search
CPC ...... H04R 1/1041; H04R 3/04; H04R 29/001; G02B 27/0172; G02B 27/0093; G02B 2027/0138; G02B 2027/0178; H03G 5/165

USPC ... 381/1, 10, 12, 17–19, 300, 306, 307, 309, 381/310, 311, 58, 74, 92, 103, 107, 387
See application file for complete search history.

(56) References Cited

U.S. PATENT DOCUMENTS

| 7,876,904 | B2* | 1/2011 | Ojala | H04S 3/02 381/20 |
| 2001/0009584 | A1* | 7/2001 | Suruga | H04H 60/04 381/119 |
| 2003/0185403 | A1* | 10/2003 | Sibbald | G10K 11/17853 381/71.6 |
| 2007/0147629 | A1* | 6/2007 | Chiloyan | H04R 1/1033 381/74 |
| 2011/0316967 | A1* | 12/2011 | Etter | H04S 7/301 348/14.16 |
| 2013/0177166 | A1* | 7/2013 | Agevik | H04R 3/00 381/74 |

(Continued)

FOREIGN PATENT DOCUMENTS

JP    2006304052    *    2/2006

*Primary Examiner* — Norman Yu
(74) *Attorney, Agent, or Firm* — Foley & Lardner LLP

(57) ABSTRACT

A method for adjusting sound (e.g., aural) output of a worn audio device includes obtaining orientation or position data that indicates an orientation or a position of the worn audio device. The method also includes determining at least one change in the orientation or position data indicating a change in orientation or position of the worn audio device. The method also includes adjusting or selecting a filter for adjusting aural output produced by the worn audio device using the orientation or position data, and operating the worn audio device to provide the sound output using the filter in response to the at least one change in the orientation or position data.

20 Claims, 17 Drawing Sheets

(56) References Cited

U.S. PATENT DOCUMENTS

| | | | | |
|---|---|---|---|---|
| 2013/0279724 A1* | 10/2013 | Stafford | ................... | H04R 5/04 |
| | | | | 381/309 |
| 2016/0134987 A1* | 5/2016 | Gorzel | .................... | H04S 7/304 |
| | | | | 381/310 |
| 2018/0063626 A1* | 3/2018 | Pong | .................. | H04N 5/23203 |
| 2019/0166435 A1* | 5/2019 | Crow | ..................... | H04R 25/43 |

* cited by examiner

WEARABLE DEVICE WITH AT-EAR CALIBRATION

FIELD OF DISCLOSURE

The present disclosure is generally related to equalization of sound output, including but not limited to equalizing sound output in a head wearable audio system.

BACKGROUND

Wearable audio output devices (e.g., speakers, headphones, ear pieces, etc.) are used in a large variety of applications. For example, wearable audio output devices can be part of head sets, head wearable displays, or other gear for augmented reality or virtual reality (VR) systems. In other applications, wearable audio devices can be part of a communication systems, such as, a personal communication system (e.g., smart phone), a military communication system (helmet mounted audio system), or an industrial communication system. The quality of sound output of a wearable audio system can be affected by movement and position.

SUMMARY

Various embodiments disclosed herein are related to a method for adjusting sound (e.g., aural) output of a worn audio device. The method includes obtaining orientation or position data that indicates an orientation or a position of the worn audio device, according to some embodiments. The method also includes determining at least one change in the orientation or position data indicating a change in orientation or position of the worn audio device, according to some embodiments. The method also includes adjusting or selecting a filter for adjusting aural output produced by the worn audio device using the orientation or position data, and operating the worn audio device to provide the sound output using the filter in response to the at least one change in the orientation or position data.

Various embodiments disclosed herein are related to a head wearable display. The head wearable display includes a speaker, at least one sensor, and a controller, according to some embodiments. The speaker is configured to provide sound to a user's ear, according to some embodiments. The at least one sensor is configured to measure orientation or position associated with the head wearable display, according to some embodiments. In some embodiments, the controller is configured to obtain the orientation or position from the sensor, track changes in the orientation or position, and adjust a filter for adjusting sound provided to the user's ear by the speaker using the orientation or position of the head wearable display.

Various embodiments disclosed herein are related to a controller for a head wearable audio device. The controller includes circuitry configured to obtain orientation and position data from an orientation and position sensor, according to some embodiments. The circuitry is also configured to determine at least one change in the orientation and position data, according to some embodiments. The circuitry is configured to adjust a filter for adjusting sound provided to a user's ear by the wearable audio device, according to some embodiments. The circuitry is configured to operate the wearable audio device to provide adjusted sound output to the user's ear using the filter, according to some embodiments.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component can be labeled in every drawing.

DETAILED DESCRIPTION

Overview

Figure 1:
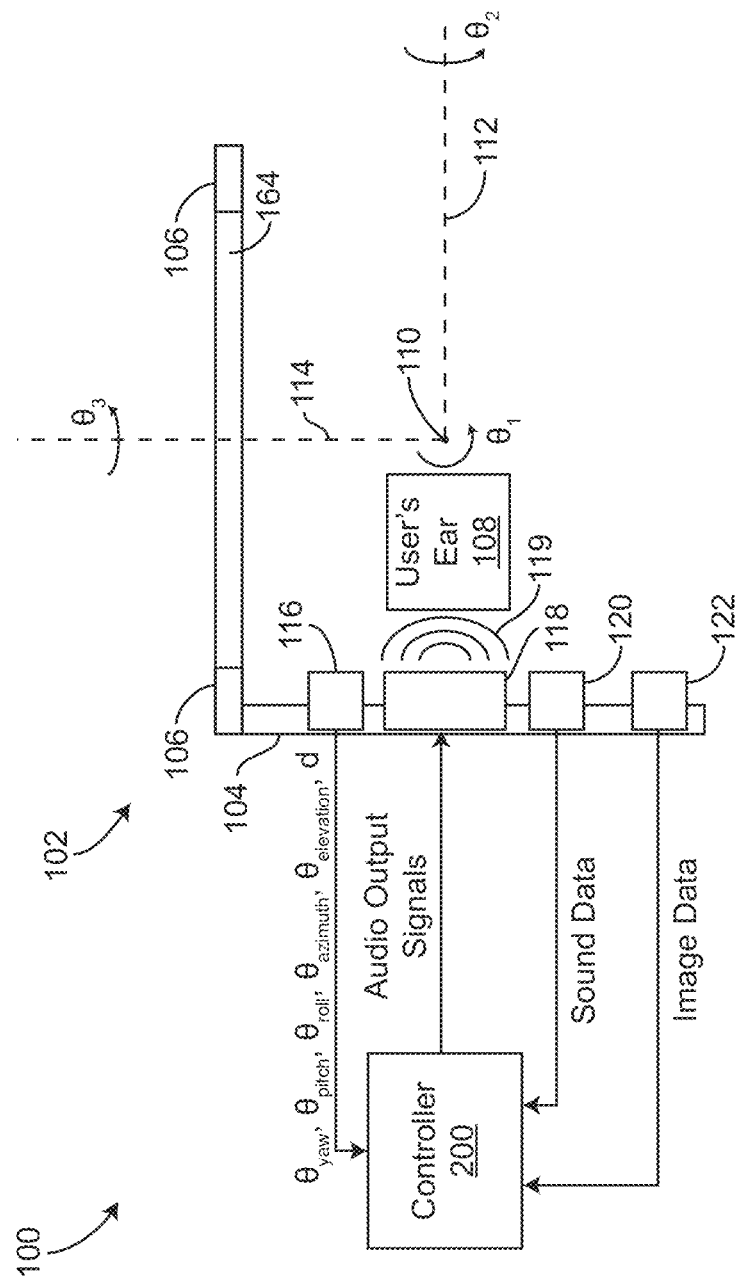
FIG. 1 is a block diagram of a wearable audio system that includes a wearable audio output device configured to provide aural signals to a user's ear and a controller, according to some embodiments.

Before turning to the FIGURES, which illustrate certain embodiments in detail, it should be understood that the present disclosure is not limited to the details or methodology set forth in the description or illustrated in the FIGURES. It should also be understood that the terminology used herein is for the purpose of description only and should not be regarded as limiting.

For purposes of reading the description of the various embodiments of the present invention below, the following descriptions of the sections of the specification and their respective contents may be helpful:
Section A describes embodiments of devices, systems, and methods for at-ear audio calibration; and
Section B describes various embodiments and computing environments of devices and systems for at-ear audio calibration.

Referring generally to the FIGURES, a wearable audio system is shown according to various embodiments. The wearable audio system may include one or more speakers, one or more orientation/position sensors, one or more microphones, and a display. In some embodiments, the wearable audio system is an augmented, mixed, or virtual reality system. For example, the wearable audio system may be head wearable goggles, glasses, or a head mounted virtual/augmented reality headset. In some embodiments, the wearable audio system includes a controller, computer, processing circuit, processing unit, etc., or other circuitry. The controller may be a local controller that is also wearable or may be remotely positioned such that the functionality thereof is performed remotely.

The controller may generate audio output signals for the speaker(s), thereby causing the speakers to project sound waves towards the user's ears. The controller can include a filter that equalizes audio signals that are used to control the speaker(s). In some embodiments, the filter is adjusted, calibrated, updated, etc., to account for orientation and/or position of the wearable audio system. The controller may generate an initial filter or an initial configuration (e.g., initial configuration parameters) of the filter based on initial orientation and/or position of the wearable audio system. In some embodiments, the controller obtains initial orientation and/or position of the wearable audio system from the orientation/position sensor(s) and determines a position/orientation of the wearable audio system relative to the user's head. The controller may use an adjustment model to initially define, configure, or create the filter. In some embodiments, the controller periodically (or in real-time) receives orientation and/or position values from the orientation/position sensor of the wearable audio device and adjusts, calibrates, updates, re-configures, or re-defines the filter based on the received orientation and/or position values. The controller may also compare currently received orientation and/or position values of the wearable audio system to the initial or baseline orientation and/or position values to determine if the filter should be updated to account for the new/current orientation and/or position values. In some embodiments, the controller uses the same model to update the filter based on currently received values of the orientation and/or position of the filter. The term filter refers to any circuitry, software, or combination thereof for affecting audio output including but not limited to digital models, digital equalization filters, circuitry that adjusts frequency response, band pass filters, low pass filters, high pass filters, or analog or digital components that modify audio output.

The controller may use a single filter to operate both left and right ear speakers, or may use separated filters for the left and right ear speakers. The controller can adjust the filters for the left and right ear speakers independently and may use different models (or models with different configuration parameters/coefficients) for the left and right ear speakers. In some embodiments, the controller is configured to use a pre-defined or pre-trained model that defines sound adjustments for the speakers (in terms of frequency) as a function of orientation and/or position of the wearable audio system. In some embodiments, the controller may update or adjust various parameters or coefficients of the model to improve the adjustments or calibrations for the filter. In some embodiments, the filter is a set of filters. In some embodiments, the left and right or multiple speakers are pre-calibrated for free field response (e.g., a response in anechoic conditions measured at a single or multiple microphones on the wearable audio system/device when the device is not worn by a user). In some embodiments, the controller uses a fixed equalization filter (to compensate for the device's free field response) with a time-varying post filter that compensates for fit-to-fit when compensation is configured more directly for the effect of the user's anatomy.

The controller may use the filter to equalize the sound output (while accounting for changes in orientation/position of the wearable audio system) to a flat response or to a desired frequency response. The controller can also verify that the desired frequency response is achieved based on sensor feedback or sound data received from the microphone(s). Advantageously, the systems and methods described herein facilitate an improved at-ear calibration that can account for changes in orientation/position. Changes in orientation/position can result in reduced sound-quality or improperly equalized sound output. When the wearable audio system is removed and replaced from the user's head or adjusted on the user's head, the filter may be updated by the controller to account for the new orientation/position of the wearable audio system and still provide the desired equalization or frequency response to the user.

A. Devices, Systems, and Methods for At-Ear Sound Calibration

Referring particularly to FIG. 1, a block diagram of a wearable audio output system 100 is shown, according to some embodiments. Audio output system 100 includes a head mounted device or head wearable device 102 (e.g., goggles, glasses, headphones, visor, helmet a headset, etc.) and a controller 200. In some embodiments, audio output system 100 includes a speaker, a sound producing device, an aural device, etc., shown as speaker 118. Speaker 118 can be a component of head wearable device 102 and may be configured to output sound waves to a user's ear 108 that wears wearable device 102. In some embodiments, audio output system 100 includes multiple speakers 118. For example, audio output system 100 can include multiple speakers 118 for each of the user's ears (e.g., right and left ears) or may include a single speaker 118 for each of the user's ear 108. In still other embodiments, audio output system 100 includes a set of different speakers 118 for each of the user's ears 108. In some embodiments, speakers 118 for the user's left and right ears 108 are controlled, calibrated, or adjusted independently. For example, the speakers 118 for the user's left ear may be calibrated for the user's left ear, while the speakers 118 for the user's right ear may be calibrated differently for the user's right ear.

Audio output system 100 also includes a microphone, a sound recording device, etc., shown as microphone 120, according to some embodiments. In some embodiments, audio output system 100 includes multiple microphones 120 for each of the user's ears 108. For example, audio output system 100 may include one or more microphones 120 that are configured to obtain audio samples at or proximate the user's left ear while also including one or more microphones 120 that are configured to obtain audio samples at or proximate the user's right ear. In some embodiments, microphones 120 are components of the wearable device 102. Advantageously, microphones 120 can be placed proximate the user's ear 108 to facilitate obtaining sound data that indicates what the user hears, thereby improving the functionality of controller 200 and enhancing sound quality output to the user's ears 108.

Audio output system 100 can also include a position/orientation sensor, an inertial measurement unit (IMU), a gyroscope, etc., shown as IMU 116. In some embodiments, IMU 116 is a component of wearable device 102. IMU 116 may be configured to record, sense, obtain, measure, etc., position and/or orientation of wearable device 102. For example, IMU 116 may measure position in two or more directions, three or more directions, etc., while also measuring orientation about one or more axes, two or more axes, three or more axes, etc. In some embodiments, IMU 116 is fixedly coupled, attached, mounted, or otherwise coupled with wearable device 102 such that IMU 116 may record or measure position and/or orientation of wearable device 102. In some embodiments, multiple IMUs 116 are fixedly coupled with wearable device 102. For example, a single IMU 116 or a first set of IMUs 116 can be fixedly coupled with wearable device 102 proximate or adjacent a user's left ear 108, while another IMU 116 or a second set of IMUs 116 may be fixedly coupled with wearable device 102 proximate or adjacent a user's right ear 108. In some embodiments, one or more IMUs 116 are otherwise positioned and fixedly coupled with wearable device 102. For example, an IMU 116 may be positioned at a nose piece, along a temple arm, along a frame, along a structural member, along a housing member, etc., of wearable device 102.

Wearable device 102 may be configured as augmented reality, mixed reality, or virtual reality goggles, glasses, head mounted device, etc., that can provide visual imagery and/or aural sound output to the user. For example, wearable device 102 may include a display 164 that is configured to provide visual imagery to the user (e.g., an optical combiner, a display screen, etc.). In some embodiments, wearable device 102 includes a frame 106 that extends at least partially along a perimeter of display 164. Display 164 may be positioned such that when wearable device 102 is worn by the user, display 164 is in front of the user's eye (e.g., the user's left eye). In some embodiments, wearable device 102 includes multiple displays 164 that are each configured to be positioned in front of one of the user's eyes when wearable device 102 is worn by the user. For example, display 164 and frame 106 may function as an eyepiece of wearable device 102. Display 164 may be a transparent, translucent, selectably transparent, selectably translucent, etc., eyepiece or display device that is configured to provide imagery to the user while allowing the user to view real-world external environment (e.g., if wearable device 102 is an augmented reality device). In some embodiments, display 164 is an opaque display device that is configured to provide imagery to the user without allowing the user to view the real-world external environment through display 164 (e.g., if wearable device 102 is a virtual reality device).

In some embodiments, wearable device 102 includes a temple arm, a structural member, an elongated member, etc., shown as temple arm 104 that extends in a direction along a side of the user's face. For example, the eyepiece (i.e., display 164 and/or frame 106) may extend in a plane that is substantially parallel with a front of the user's face, while temple arm 104 can extend in a direction that is substantially perpendicular with the eyepiece. Temple arm 104 can extend along and rest upon a user's earlobe to facilitate removably wearing wearable device 102. For example, temple arm 104 may be contoured, straight, etc., to facilitate resting upon the user's ear. Temple arm 104 may be translationally fixedly coupled with frame 106 and/or display 164. In some embodiments, temple arm 104 is rotatably or pivotally fixedly coupled with frame 106. In some embodiments, temple arm 104 is rotatably or pivotally coupled with frame 106 such that temple arm 104 may rotate or pivot relative to frame 106. In some embodiments, the wearable device 102 is part of a helmet or other head gear.

In some embodiments, temple arm 104 is configured to extend laterally relative to the eyepiece. Temple arm 104 may extend a distance such that temple arm 104 contacts, engages, extends past, rests upon, is adjacent to, is proximate to, etc., the user's ear 108. In some embodiments, wearable device 102 includes multiple temple arms 104. For example a first or right temple arm 104 may be configured to rest upon a user's left ear 108, while a second or left temple arm 104 may be configured to rest upon a user's left ear.

In some embodiments, IMU 116, speaker 118, and microphone 120 are fixedly coupled, mounted, attached, etc., on temple arm 104. For example, IMU 116 may be positioned along temple arm 104 such that IMU 116 measures or senses position and/or orientation of wearable device 102. In some embodiments, speaker 118 is positioned along temple arm 104 such that speaker 118 is configured to output sound waves 119 towards a corresponding one of the user's ears 108. In some embodiments, speaker 118 is positioned such that speaker 118 emits sound waves 119 from an inner surface of temple arm 104 towards the corresponding one of the user's ears 108.

Microphone 120 may be positioned along temple arm 104 such that microphone 120 is proximate, adjacent, neighboring, etc., speaker 118. In this way, microphone 120 may record audio (e.g., sound output level) produced by speaker 118 at the user's ear 108.

Audio output system 100 also includes a controller, a processing device, a processor, processing circuitry, a circuit, a computer, a computing device, etc., shown as controller 200. Controller 200 can be positioned locally on audio output system 100, or may be positioned remotely from audio output system 100. For example, controller 200 can be positioned within a housing of audio output system 100 that is fixedly coupled with one or more structural members of audio output system 100. In some embodiments, controller 200 is remotely positioned and communicably coupled (e.g., wirelessly) with a local processing unit of wearable device 102. In this way, any of the processing, functionality, techniques, operations, etc., of controller 200 can be performed locally or remotely.

Controller 200 is communicably coupled (e.g., wiredly, wirelessly, directly, indirectly, etc.) with IMUs 116, speakers 118, and microphones 120. In some embodiments, controller 200 is configured to calibrate, adjust, etc., speakers 118 using data received from IMUs 116 and/or microphones 120. Controller 200 can be configured to adjust an operation of speakers 118 for each of the user's ears 108 either in unison or independently. For example, controller 200 can adjust the operation of a left one of speakers 118 to calibrate the left speaker 118 for the user's left ear 108, while adjusting the operation of a right one or speakers 118 to calibrate the right speaker 118 for the user's right ear 108. In some embodiments, the operation of speakers 118 is adjusted or calibrated uniformly across both speakers 118 such the adjustments to the left speaker 118 are the same as the adjustments to the right speaker 118. In some embodiments, controller 200 is configured to determine the adjustments or calibrations for speakers 118 based on or using the data received from IMU(s) 116 and/or microphone(s) 120.

IMU(s) 116 can be configured to measure orientation and/or position of wearable device 102 and provide the measured orientation and/or position of wearable device 102 to controller 200. In some embodiments, IMU 116 is configured to measure a yaw or first angle, $\theta_{yaw}$, about a yaw or first axis 110, a pitch or second angle, $\theta_{pitch}$, about a pitch or a second axis 112, and a roll or third angle, $\theta_{roll}$, about a roll or a third axis 114. In some embodiments, IMU 116 measures relative orientation of wearable device 102. In some embodiments, IMU 116 is configured to measure orientation of wearable device 102 relative to the user's head. In some embodiments, IMU 116 is configured to measure orientation of wearable device 102 and controller 200 may be configured to determine, calculate, obtain, etc., orientation of wearable device 102 relative to the user's head based on a known orientation of the user's head, or based on other sensor input (e.g., based on imagery of the user's head obtained by a camera of wearable device 102). In some embodiments, IMU 116 is configured to provide values of $\theta_{yaw}$, $\theta_{pitch}$, $\theta_{roll}$, $\theta_{azimuth}$, and $\theta_{elevation}$, to controller 200 in real-time or at scheduled intervals (e.g., every 1 second, every 0.5 seconds, every 0.1 seconds, upon start-up of controller 200, in response to an event such as a shift in detected position/orientation, in response to a user input, etc.). In some embodiments, controller 200 is configured to request data from IMU(s) 116 and IMU(s) 116 can respond by sending controller 200 measured values of orientation (e.g., values of $\theta_1$, $\theta_2$, and $\theta_3$) and/or position.

IMU(s) 116 can also be configured to measure position or distance of wearable device 102, according to some embodiments. In some embodiments, IMU(s) 116 are configured to measure position of wearable device 102 along multiple axes or in multiple directions (e.g., in spherical coordinates). For example, IMU(s) 116 may be configured to measure an azimuth or fourth angle, $\theta_{azimuth}$, an elevation or fifth angle, $\theta_{elevation}$, and a distance d. In some embodiments, IMU(s) 116 measures the position of wearable device 102 along three separate axes that are different than the first or yaw axis 110, the second or pitch axis 112, and the third or roll axis 114, respectively. For example, IMU(s) 116 may measure d along an axis that is different than the first or yaw axis 110, the second or pitch axis 112, and the third or roll axis 114. In some embodiments, the positional data of wearable device 102 is recorded, measured, sensed, detected, obtained, etc., by a separate sensor than IMU 116. For example, a separate position sensor can be positioned on wearable device 102 that is configured to measure the position of wearable device 102, independently of IMU 116 that measures orientation or angular position of wearable device 102. In some embodiments, IMU(s) 116 and/or the separate sensors that measure position of wearable device 102 are communicably coupled with controller 200 and provide controller 200 with the positional values of $\theta_{azimuth}$, $\theta_{elevation}$, and d in real-time, at scheduled intervals, in response to an event, in response to a user input or a user action, etc.

When wearable device 102 is removed from the user's head and replaced onto the user's head, an orientation and/or position of wearable device 102 relative to the user's head may shift or change. This can result in poorly calibrated speakers 118 and may have adverse effects on sound quality of wearable device 102. A transfer function that describes sound transmission from speakers 118 to the user's ear 108 (e.g., into the user's ear canal) may need to be calibrated or adjusted if the orientation and/or position of wearable device 102 relative to the user's head shifts or changes. The goal of calibration of the transfer function is to consistently match a desired frequency response (e.g., a flat response) regardless of orientation and/or position of the wearable device 102 relative to the user's head, according to some embodiments. Placing a microphone at the user's ear canal to obtain a frequency response of sound waves 119 may be impractical in terms of user comfort, maintenance, and aesthetics. However, microphone 120 can be placed on temple arm 104 proximate the user's ear 108. Additionally, controller 200 can adjust a filter (e.g., a snapshot calibration filter) that is used to control speaker 118. Controller 200 may adjust the filter based on the position and/or orientation of wearable device 102 (e.g., relative to the user's head) to achieve a flat response.

Figure 2:
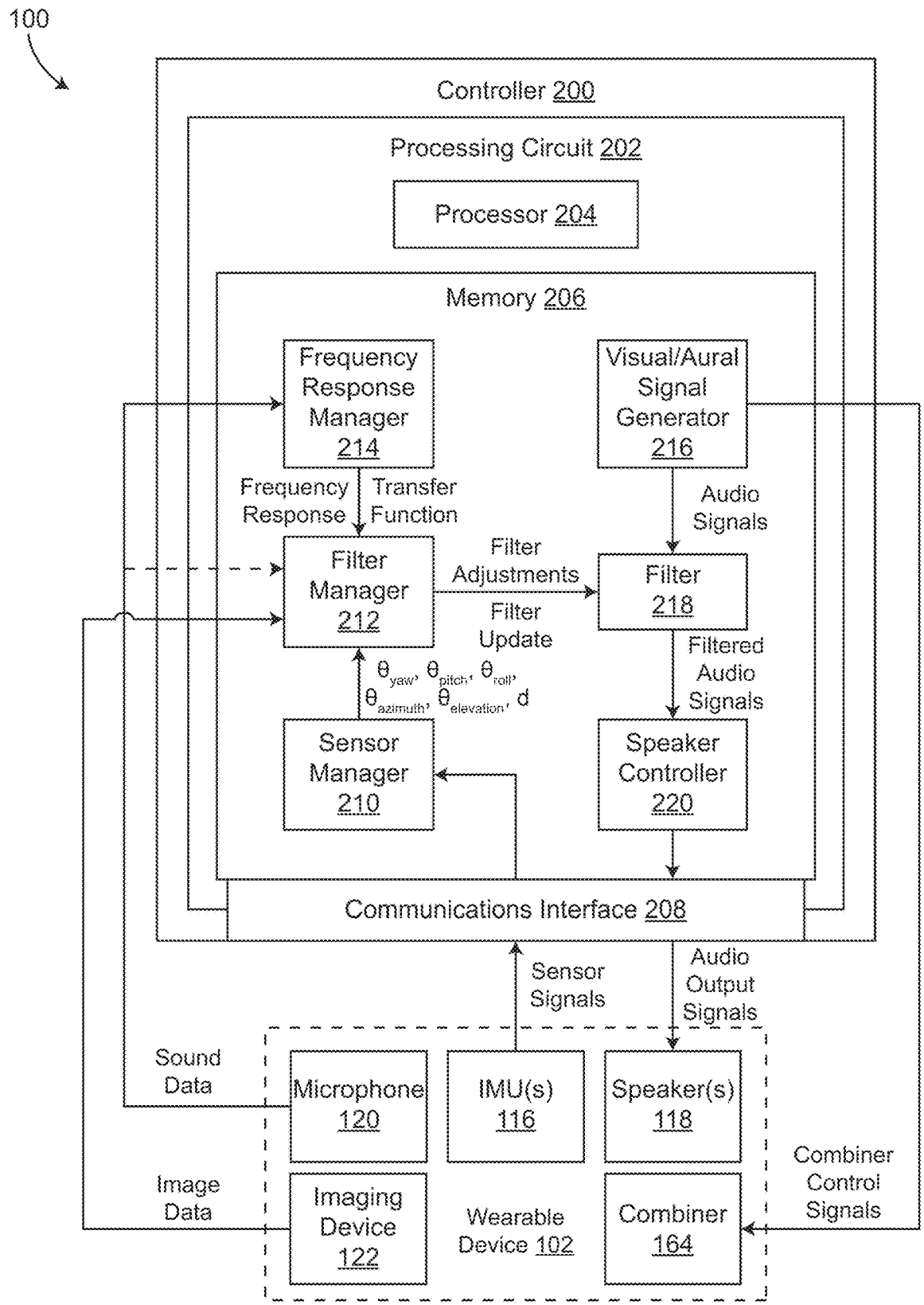
FIG. 2 is a block diagram of the controller of the wearable audio system of FIG. 1, according to some embodiments.

Referring particularly to FIG. 2, audio output system 100 is shown in greater detail, according to some embodiments. Specifically, FIG. 2 shows controller 200 and the various components thereof in greater detail, according to some embodiments. Controller 200 can include a communications interface 208 that facilitates communications (e.g., the transfer of data) between controller 200 and wearable device 102 (e.g., microphone(s) 120, IMU(s) 116, speaker(s) 118, etc., or any other systems, sensors, devices, etc., of wearable device 102). The communications interface 208 can be or include wired or wireless communications interfaces (e.g., jacks, antennas, transmitters, receivers, transceivers, wire terminals, etc.) for conducting data communications between the controller 200 and external systems, sensors, devices, etc. (e.g., microphones 120, IMU(s) 116, speaker(s) 118, display 164, etc.). In various embodiments, communications via the communications interface 208 can be direct (e.g., local wired or wireless communications) or via a communications network (e.g., a WAN, the Internet, a cellular network, etc.). For example, the interface 208 can include an Ethernet card and port for sending and receiving data via an Ethernet-based communications link or network. In another example, the interface 208 can include a Wi-Fi transceiver for communicating via a wireless communications network. In another example, the interface 208 can include cellular or mobile phone communications transceivers. In some embodiments, the interface 208 is an Ethernet interface or a USB interface.

Still referring to FIG. 2, the controller 200 is shown to include a processing circuit 202 including a processor 204 and memory 206. The processing circuit 202 can be communicably connected to the communications interface 208 such that the processing circuit 202 and the various components thereof can send and receive data via the communications interface. The processor 204 can be implemented as a general purpose processor, an application specific integrated circuit (ASIC), one or more field programmable gate arrays (FPGAs), a group of processing components, or other suitable electronic processing components.

The memory 206 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. The memory 206 can be or include volatile memory or non-volatile memory. The memory 206 can include database components, object code components, script components, or any other type of information structure for supporting the various activities and information structures described in the present application. According to some embodiments, the memory 206 is communicably connected to the processor 204 via the processing circuit 202 and includes computer code for executing (e.g., by the processing circuit 202 and/or the processor 204) one or more processes described herein.

Controller 200 is shown communicably coupled with microphone(s) 120 (e.g., sound detection devices/sensors), IMU(s) 116, and speaker(s) 118. In some embodiments, controller 200 is configured to generate and provide audio output signals to speaker(s) 118 so that speaker(s) 118 operate to provide sound waves to the user's ears. Controller 200 can be configured to receive sensor signals from IMU(s) 116 and sound data from microphone(s) 120 and may use the sensor signals and/or the sound data to generate audio output signals for speaker(s) 118.

Referring still to FIG. 2, memory 206 is shown to include a sensor manager 210, a filter manager 212, an frequency response manager 214, a visual/aural signal generator 216, a filter 218, and a speaker controller 220, according to some embodiments. In some embodiments, sensor manager 210, filter manager 212, frequency response manager 214, visual/aural signal generator 216, filter 218, and speaker controller 220 represent instructions, scripts, functions, etc., that are stored in memory 206 and implemented by processor 204 and/or processing circuit 202. In some embodiments, memory 206 of controller also includes various modules, components, processing circuitry, instructions, etc., for operating display 164 to provide imagery (e.g., augmented reality imagery, virtual reality imagery, mixed reality imagery, etc.) to the user. Sensor manager 210 is configured to receive sensor signals from IMU(s) 116 and provide values of the orientation (e.g., values of $\theta_{yaw}$, $\theta_{pitch}$, and $\theta_{roll}$) and/or the position (e.g., values of $\theta_{azimuth}$, $\theta_{elevation}$, and d) of wearable device 102 (or orientation/position of wearable device 102 relative to the user's head) to filter manager 212 for adjusting filter 218. Frequency response manager 214 may receive sound data as obtained by microphone(s) 120 at the user's ears and verify that filter 218 has been adjusted properly based on the received sound data. In some embodiments, frequency response manager 214 provides equalization results to filter manager 212 and filter manager 212 uses the equalization results to further calibrate filter 218. Filter 218 may be adjusted by filter manager 212 and can receive audio signals from visual/aural signal generator 216. Filter 218 may receive audio signals from visual/aural signal generator 216 and output filtered audio signals to speaker controller 220. Speaker controller 220 can generate audio output signals for speaker(s) 118 to operate speaker(s) 118 according to the filtered audio signals. In some embodiments, visual/aural signal generator 216 is configured to generate and/or provide audio signals to filter 218. Visual/aural signal generator 216 may also be configured to generate visual signals (e.g., combiner control signals) and provide the combiner control signals to display 164. In some embodiments, visual/aural signal generator 216 is configured to perform any of the functionality of image renderer 2560 as described in greater detail below with reference to FIG. 25.

In some embodiments, filter 218 is configured to equalize audio signals and provide filtered/equalized audio signals to speaker controller 220. Filter 218 may equalize the audio signals received from visual/aural signal generator 216 to provide audio output signals to the speakers 118. The filter adjustments can be coefficients for the filter 218 embodied as a digital equalizer in some embodiments. The coefficients can be dynamically provided by the filter manager 212 in response to data from the sensor manager 210.

Sensor manager 210 is configured to receive raw sensor signals from IMU(s) 116 and output values of $\theta_{yaw}$, $\theta_{pitch}$, $\theta_{roll}$, $\theta_{azimuth}$, $\theta_{elevation}$, and d to filter manager 212. In some embodiments, sensor manager 210 receives a voltage from IMU(s) 116 and provides values of the orientation and/or the position to filter manager 212. Sensor manager 210 may receive real-time sensor signals from IMU(s) 116, or may receive sensor signals from IMU(s) 116 periodically. In some embodiments, sensor manager 210 queries IMU(s) 116 for current sensor signals, and IMU(s) 116 respond with the sensor signals. Sensor manager 210 may also obtain the sensor signals from IMU(s) 116 in response to receiving a user input (e.g., a user request to re-calibrate filter 218, a start-up of controller 200 and/or wearable device 102, etc.). Sensor manager 210 provides the values of the orientation and/or position of wearable device 102 to filter manager 212 so that filter manager 212 can use the orientation and/or position of wearable device 102 to define a baseline model, initially calibrate filter 218, adjust filter 218, re-calibrate filter 218, adjust a calibration of filter 218, etc. In some embodiments, the position of wearable device 102 is referred to as p and the orientation of wearable device 102 is referred to as $\theta$ where $p=[\theta_{azimuth} \; \theta_{elevation} \; d]$ and $\theta=[\theta_{yaw} \; \theta_{pitch} \; \theta_{roll}]$.

Filter manager 212 may be configured to receive image data from imaging device 122 and/or initial position (e.g., initial values of $\theta_{azimuth}$, $\theta_{elevation}$, and d) and initial orientation (e.g., initial values of $\theta_{yaw}$, $\theta_{pitch}$, and $\theta_{roll}$). Filter manager 212 can generate, obtain, calculate, create, define, etc., a baseline filter 218 using any of, or a combination of, the image data received from imaging device 122, the sound data received from microphone(s) 120, equalization results received from frequency response manager 214, and initial position/orientation measurements (e.g., received from sensor manager 210. In some embodiments, filter manager 212 generates various initial values for filter 218 and writes the initial values to filter 218. Filter manager 212 can use the image data received from imaging device 122 and the initial values of the position/orientation of wearable device 102 to determine a relative position and/or a relative orientation between the user's head and the wearable device 102. In some embodiments, filter manager 212 stores the initial values of the position and/or the orientation as a baseline position/orientation of wearable device 102 and compares subsequently received values of the position and/or orientation of wearable device 102 to the initial values/measurements. In this way, filter manager 212 can identify changes in the position and/or orientation of the wearable device 102 relative to the initial position/orientation (e.g., the baseline position/orientation) of wearable device 102.

Filter manager 212 can use a machine learning algorithm or a neural network in combination with computer vision and/or acoustic simulations to build, generate, define, construct, etc., a model that predicts a target at-ear transfer function. In some embodiments, filter manager 212 uses an initial acoustic measurement (e.g., sound data received from microphone(s) 120) of the transfer function and may derive or define a calibration filter from this initial acoustic measurement.

The filter 218 that is defined by or generated by filter manager 212 may be a filter that offers accuracy for a specific orientation/position of wearable device 102 relative to the user's head. However, when wearable device 102 is removed (e.g., for cleaning, when the user adjusts wearable device 102, etc.) by the user, and then replaced on the user's head (or moved, rotated, or re-positioned while remaining on the user's head), the position and/or orientation of wearable device 102 may shift relative to the user's head. For example, the filter 218 may be initially configured by filter manager 212 for initial positional values: $\theta_{azimuth,initial}$, $\theta_{elevation,initial}$, $d_{initial}$ and for initial orientation values: $\theta_{yaw,initial}$, $\theta_{pitch,initial}$, and $\theta_{roll,initial}$. In some embodiments, filter manager 212, frequency response manager 214, sensor manager 210, and filter 218 cooperatively perform an initial calibration procedure, or an initial calibration process. The calibration process can include obtaining or acquiring the initial orientation and the initial position of wearable device 102 along with an estimation of relevant frequency responses that are based on either acoustic measurements (e.g., sound data obtained by microphone(s) 120), or using image data from imaging device 122 in combination with machine learning and/or computer vision.

Figure 3:
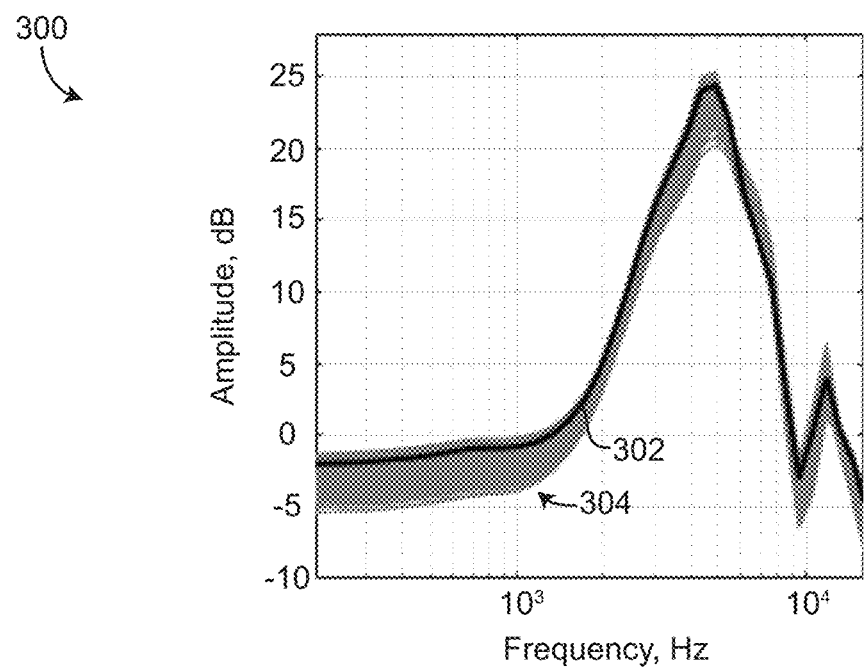
FIG. 3 is a graph of sound amplitude versus frequency as output by a speaker of the wearable audio system of FIG. 1 for different orientations/positions of the wearable audio system of FIG. 1, according to some embodiments.

Referring particularly to FIGS. 2 and 3, graph 300 shows a frequency response as determined by frequency response manager 214. Graph 300 includes a first curve fit 302 that represents an initially estimated transfer function. The Y-axis of graph 300 shows amplitude in decibels (dB), while the X-axis of graph 300 shows frequency in Hertz (Hz). In some embodiments, graph 300 is generated by frequency response manager 214 based on sound data obtained by microphone(s) 120. Frequency response manager 214 and/or filter manager 212 may obtain the initial estimation of the transfer function by performing a regression, a curve fitting technique, generating a model, etc., using the frequency response.

Graph 300 also includes multiple other frequency response series 304 that result from adjustments of wearable device 102. For example, the multiple series 304 show an impact that adjusting wearable device 102 N=386 times can have on the frequency response. As shown in graph 300, adjusting wearable device 102 may result in the frequency response deviating from the first curve fit 302, indicating that spatial adjustment and/or rotation of wearable device 102 may impact the sound output of speaker(s) 118. As shown in FIG. 3, the first or initial curve fit 302 may suitably equalize or calibrate the sound output (e.g., the frequency response) of speaker(s) 118, however, after wearable device 102 is adjusted (especially numerous times), the initial curve fit 302 may require adjustment to suitably equalize or calibrate the sound output (e.g., the frequency response) of speaker(s) 118.

Referring again to FIG. 2, after the wearable device 102 is removed and re-placed on the user's head or adjusted on the user's head, the wearable device 102 may have a position: $\theta_{azimuth,new}$, $\theta_{elevation,new}$, and d and an orientation: $\theta_{yaw,new}$, $\theta_{pitch,new}$, and $\theta_{roll,new}$, where at least one of (i) $\theta_{azimuth,new} \neq \theta_{azimuth,initial}$; (ii) $\theta_{elevation,new} \neq \theta_{elevation,initial}$; (iii) $d_{new} \neq d_{initial}$; (iv) $\theta_{yaw,new} \neq \theta_{yaw,initial}$; (v) $\theta_{pitch,new} \neq \theta_{pitch,initial}$; and (vi) $\theta_{roll,new} \neq \theta_{roll,initial}$ is/are true. Since filter 218 is calibrated for the initial orientation/position of wearable device 102, when wearable device 102 is repositioned, rotated, adjusted, removed, etc., so that any of (or any combination thereof) $\theta_{yaw}$, $\theta_{pitch}$, $\theta_{roll}$, $\theta_{azimuth}$, $\theta_{elevation}$, or d change, the transfer function may change, and filter 218 and speaker controller 220 may operate speaker(s) 118 to output un-equalized or reduced quality sound.

Accordingly, filter 218 may need be adjusted to account for re-positioning or rotation of wearable device 102 to enhance sound emitted to the user's ear by speaker(s) 118. Filter manager 212 may determine an adjustment for filter 218 using the values of the position p of wearable device 102 and the values of the orientation $\theta$ of wearable device 102 in an adjustment model that correlates changes in orientation/position of wearable device 102 to corresponding changes in the frequency response. In some embodiments, filter manager 212 uses an adjustment or calibration model shown in Equation (1) below:

$$y=\beta_0+\beta_1 x_1+\beta_2 x_2 \beta_3 x_3+\beta_4 x_4+\beta_5 x_5+\beta_6 x_6=x\beta^T \quad (1)$$

where y is an output of the adjustment model (e.g., y=−EQed), $\beta_0$, $\beta_1$, $\beta_2$, $\beta_3$, $\beta_4$, $\beta_5$, and $\beta_6$ are coefficients of the adjustment model, and $x_1$, $x_2$, $x_3$, $x_4$, $x_5$, and $x_6$ are inputs to the adjustment model (e.g., $\theta_{yaw}$, $\theta_{pitch}$, $\theta_{roll}$, $\theta_{azimuth}$, $\theta_{elevation}$, and d). In some embodiments, the adjustment model shown in Equation (1) above operates independently at each individual frequency band. In some embodiments, the adjustment model used by filter manager 212 depends on a type of audio output system 100. For example, if audio output system 100 is a head mounted display device with speakers, filter manager 212 may use values of the coefficients of the adjustment model that are different than values of the coefficients used for augmented reality glasses. In this way, filter manager 212 can use different adjustment models (e.g., different values of the coefficients) based on a model, type, configuration, structural arrangement, etc., of audio output system 100. In some embodiments, filter manager 212 uses an adjustment model or values of the coefficients of the adjustment model based on a head size, shape, etc., of the user. The head size, shape, etc., may be obtained from strain gauges, imaging devices, etc., of the audio output system 100 or may be provided as a user input.

In some embodiments, filter manager 212 and/or filter 218 use Equation (2) in place of Equation (1) to determine a correction ΔEQ for a particular position and rotation set (e.g., for a particular set of position and orientation of wearable device 102):

$$\Delta EQ = g(p, \theta, \beta) \tag{2}$$

where ΔEQ is the EQ correction for the particular position and rotation of wearable device 102, and g represents an arbitrary mapping or functional relationship between position and rotational data and EQ correction which is encoded in the weights or coefficients β.

It should be understood that while the position p and orientation θ of wearable device 102 are described herein using a particular coordinate system, any coordinate system may be used for the position p and the orientation θ of wearable device 102. For example, the position p and/or orientation θ of wearable device 102 may be obtained, expressed, and/or used in a Cartesian coordinate system, a cylindrical coordinate system, a spherical coordinate system, etc., or any combination thereof.

In some embodiments, the coefficients of the adjustment model are updated as audio output system 100 is used. For example, as filter manager 212 acquires or obtains new data, filter manager 212 can re-perform any of the model generation or regression techniques described herein to update the values of the coefficients of the adjustment model. Filter manager 212 may use a neural network or adjust the adjustment model so that the adjustment model is tailored for a particular user and provides improved sound quality (e.g., improved equalization) for the particular user.

Referring particularly to FIGS. 10-15, graphs 1000, 1100, 1200, 1300, 1400, and 1500 demonstrate an effect of various values of the orientation (i.e., $\theta_{yaw}$, $\theta_{pitch}$, and $\theta_{roll}$) and various values of the position (i.e., $\theta_{azimuth}$, $\theta_{elevation}$, and d) on sound amplitude in dB (at a frequency of 4865 Hz), according to some embodiments. Graph 1000 shown in FIG. 10 includes scatter data 1002 that shows how different values of the azimuth $\theta_{azimuth}$ of wearable device 102 affects sound amplitude. Graph 1100 shown in FIG. 11 includes scatter data 1102 that shows how different values of the azimuth $\theta_{elevation}$ of wearable device 102 affects sound amplitude. Graph 1200 shown in FIG. 12 includes scatter data 1202 that shows how different values of the distance d of of wearable device 102 affects sounds amplitude. Graph 1300 shown in FIG. 13 includes scatter data 1302 that shows how different values of the pitch $\theta_{pitch}$ of wearable device 102 affects sound amplitude. Graph 1400 shown in FIG. 14 includes scatter data 1402 that shows how different values of the yaw $\theta_{yaw}$ of wearable device 102 affects sounds amplitude. Graph 1500 shown in FIG. 15 includes scatter data 1502 that shows how different values of the roll $\theta_{roll}$ of wearable device 102 affects sound amplitude.

As shown in FIGS. 10-15, a strongest correlation may occur between yaw $\theta_{yaw}$ and/or roll $\theta_{roll}$ of wearable device 102 and the sound amplitude in dB. In some embodiments, the adjustment model shown in Equation (1) above is modified to include only the position and/or orientation variables that have a strongest effect, a largest impact, a highest correlation, etc., on the sound amplitude. For example, the adjustment model shown in Equation (1) above may be modified to include only a subset of the position and/or orientation variables (e.g., only the yaw $\theta_{yaw}$ and the roll $\theta_{roll}$). In some embodiments, the adjustment model shown in Equation (1) is a pre-defined model that is pre-loaded onto controller 200. In some embodiments, the adjustment model shown in Equation (1) is generated by filter manager 212 based on receive sound data from microphone(s) 120 and orientation/position data received from IMU(s) 116. In some embodiments, the adjustment model shown in Equation (1) is updated or modified during use of audio output system 100. For example, the values of the coefficients of the adjustment model may be updated based on the sound data received from microphone 120 and sensor signals received from IMU(s) 116. In some embodiments, the values of the coefficients of the adjustment model are updated using a regression technique (e.g., a linear regression, a machine learning technique, a random forest regression, etc.) that is performed on any of scatter data 1002, scatter data 1102, scatter data 1202, scatter data 1302, scatter data 1402, or scatter data 1502. In some embodiments, a linear regression is performed on any of the scatter data acquired over a time interval (e.g., data indicating a relationship between any of the position/orientation variables and the sound amplitude) and a slope between the sound amplitude and the values of the position/orientation variables is used for the coefficients of the adjustment model. Updating, modifying, simplifying, etc., the adjustment model can reduce processing requirements of controller 200.

Referring again to FIG. 2, in some embodiments, filter manager calculates the adjustment or calibration $x\beta^T$ for the filter 218 based on the position p and/or orientation θ of wearable device 102 (e.g., a current position p and a current orientation θ) and provides the adjustment $x\beta^T$ to filter 218. The adjustment or calibration $x\beta^T$ may adjust or calibrate filter 218 to account for changes in the position and/or orientation of wearable device 102 in real-time. In some embodiments, filter 218 is an equalization filter. In some embodiments, filter 218 is adjusted or calibrated using the adjustment or the calibration $x\beta^T$ received from filter manager 212. For example, filter 218 may receive audio signals from visual/aural signal generator 216, filter or equalize the audio signals, and provide filtered audio signals to speaker controller 220. In some embodiments, filter 218 uses Equation (3) shown below to output filtered audio signals:

$$EQedCorrected(f) = EQed(f) + x\beta^T \tag{3}$$

where EQedCorrected(f) is the output of filter 218 (e.g., the filtered audio signals), EQed(f) is an initial configuration of filter 218 (e.g., an initial configuration of an equalization filter), $x\beta^T$ is the adjustment or calibration for filter 218 as determined by filter manager 212 (to account for position and/or orientation of wearable device 102), and f is the frequency of the audio signals that are input to filter 218.

If filter 218 and/or filter manager 212 use Equation (2) instead of Equation (1) to determine the correction $\Delta EQ$ for the particular position and rotation of wearable device 102, filter 212 may use Equation (4) shown below instead of Equation (3):

$$EQedCorrected(f) = EQed(f) + \Delta EQ \qquad (4)$$

In this way, filter 218 can output the filtered audio signals to speaker controller 220 to account for changes in the position p and/or orientation θ of wearable device 102. Speaker controller 220 may receive the filtered audio signals from filter 218 and operate speaker(s) 118 to provide, output, or emit sound waves to the user's ear(s) according to the filtered audio signals.

Figure 4:
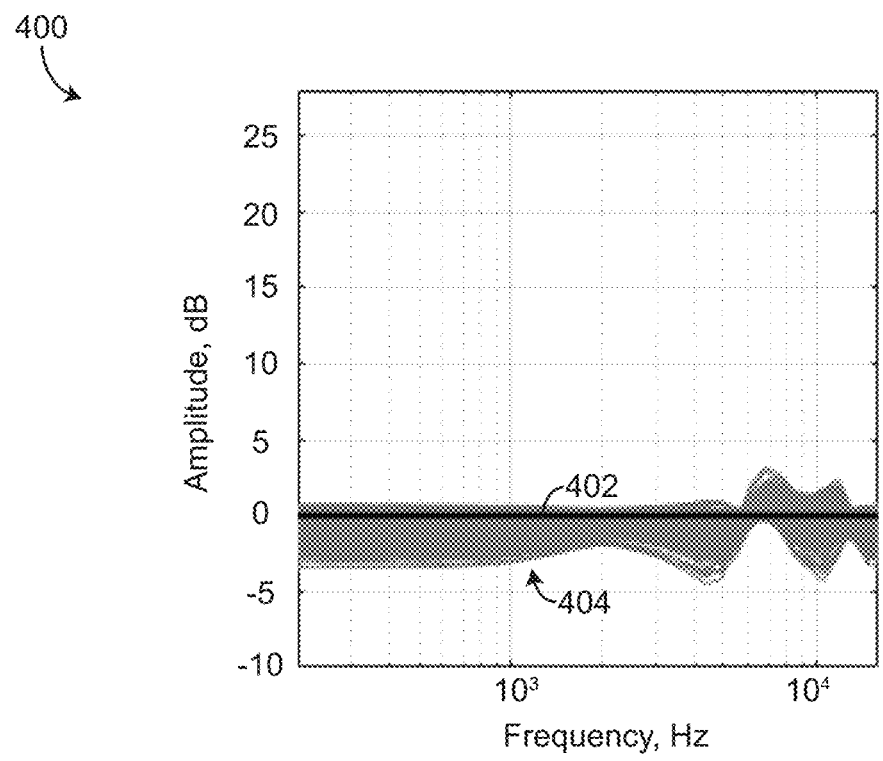
FIG. 4 is a graph of the sound amplitude versus frequency of FIG. 3 with an equalization filter that does not account for orientation/position of the wearable audio system of FIG. 1, according to some embodiments.

Referring particularly to FIG. 4, a graph 400 shows a frequency response of sound output by speaker(s) 118, without accounting for changes in the position p and/or orientation θ of wearable device 102 (e.g., when filter 218 does not include the adjustment or calibration $x\beta^T$ or does not include an updated adjustment or calibration $x\beta^T$). As shown in graph 400 and represented by series 402, the filter 218 initially equalizes the frequency response. However, after wearable device 102 is removed and replaced on the user, adjusted, moved, shifted, rotated, etc., N=386 times, the filter 218 may decrease in its efficacy for equalization as represented by multiple series 404. Series 404 each represent a different fit (e.g., a newly adjusted position and/or orientation) of wearable device 102. As shown in graph 400, applying filter 218 without accounting for changes in the orientation θ and/or the position p of wearable device 102 may result in a more equalized response when compared to graph 300 (shown in FIG. 3). However, due to the changes in position p and/or orientation θ of wearable device 102, the frequency response deviates from series 402 (e.g., approximately 4-5 dB).

Figure 5:
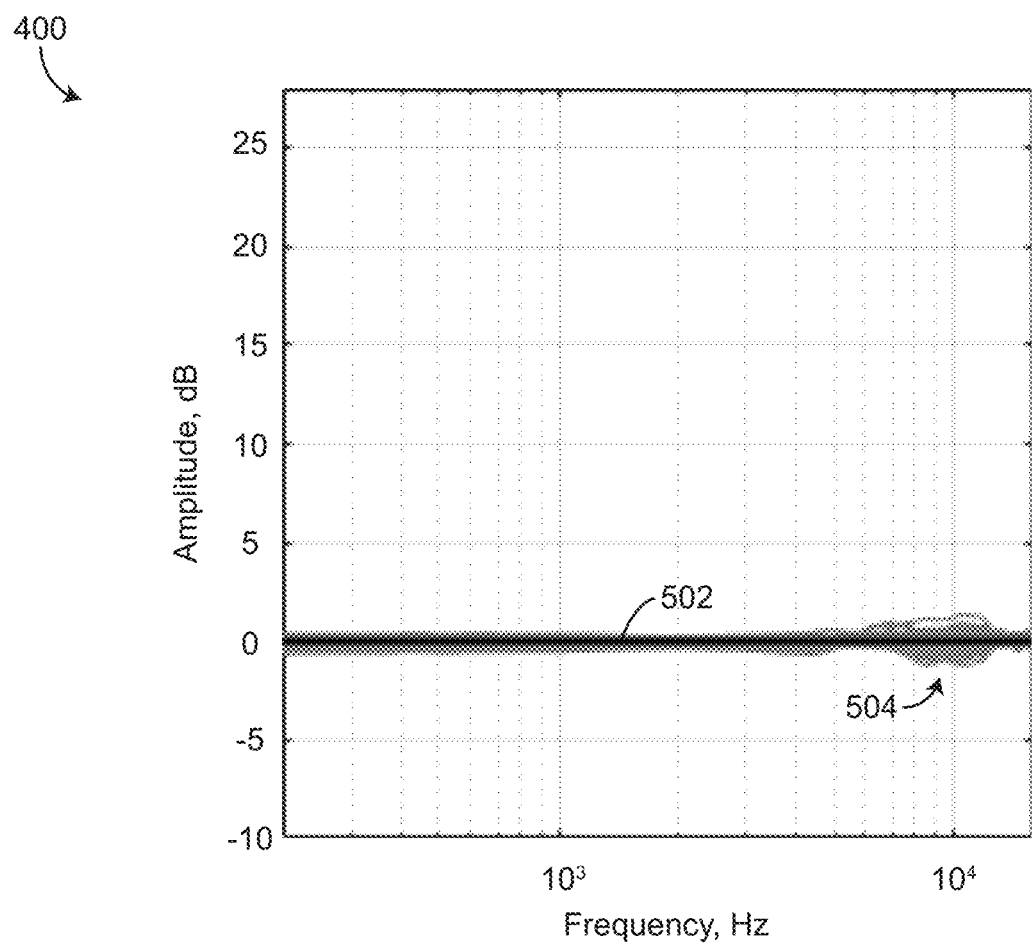
FIG. 5 is a graph of the sound amplitude versus frequency of FIG. 3 with an equalization filter that accounts for orientation/position of the wearable audio system of FIG. 1, according to some embodiments.

Referring particularly to FIG. 5, a graph 500 shows a frequency response of sound output by speaker(s) 118, when filter 218, filter manager 212, and sensor manager 210 are configured to cooperatively adjust or calibrate filter 218 to account for changes in the position p and/or orientation θ of wearable device 102. Graph 500 includes series 502 which may be the same as or similar to series 402 of graph 400. Specifically, series 502 shows the initial equalization performed by filter 218. Graph 500 also includes multiple series 504, which each correspond to a different fit (e.g., a different position and/or orientation) of wearable device 102. As shown in graph 500 of FIG. 5, when filter 218 uses the adjustment/calibration $x\beta^T$ received from filter manager 212 to account for changes of position and/or orientation of wearable device 102, the frequency response of sound output by speaker(s) 118 has a flatter response. Advantageously, using the real-time position and/or orientation of wearable device 102 facilitates an improved filter 218 which provides uniform sound output to the user's ear 108, regardless of changes in the position and/or orientation of the wearable device 102. By incorporating a model that uses the position and orientation data acquired from IMU(s) 116, controller 200 can operate speaker(s) 118 to achieve an improved approximation to the target flat response as shown in FIG. 5. As shown in FIG. 5, utilizing filter manager 212 to generate filter adjustments or filter updates for filter 218 that account for position/changes in wearable device 102 may facilitate sound output error or deviation to +/−1 dB. Reducing sound output error may enhance sound quality provided to the user's ear 108 by speaker 118 and can enhance sound quality of spatial sound in particular (e.g., when the variation of sound amplitude in one ear should be low in addition to a difference between the sound amplitude error between left and right ears being low).

As shown in FIGS. 3-5, filter manager 212 and filter 218 may operate up to 16 kilo-Hz, according to some embodiments. In other embodiments, filter manager 212 and filter 218 operate at least across a range of 20 Hz to 20 kilo-Hz. In some embodiments, filter 218 and filter manager 212 operate across a range of 100 Hz to 14-16 kilo-Hz. In some embodiments, the techniques or functionality of the systems and methods described herein can be used to adjust an output frequency response of a sound producing device (e.g., a speaker) at any selectable frequency range between 20 Hz and 20 kilo-Hz.

Referring again to FIG. 2, filter manager 212 may store initial position $p_{initial}$ and initial orientation $\theta_{initial}$ of wearable device 102 and compare currently received or real-time values of the position $p_{current}$ and/or currently received or real-time values of the orientation $\theta_{current}$ to the initial orientation and position values. For example, filter manager 212 may receive the current position and orientation of wearable device 102 from sensor manager 210 but only adjust, calibrate, recalibrate, etc., filter 218 in response to the current position and/or the current orientation deviating from the initial position and/or the initial by some predetermined amount. Filter manager 212 calculates a difference between the initial position or initial orientations and the current position or current orientation of wearable device 102:

$$\Delta\theta_{yaw} = |\theta_{yaw,initial} - \theta_{yaw,current}| \qquad (5)$$

$$\Delta\theta_{pitch} = |\theta_{pitch,initial} - \theta_{pitch,current}| \qquad (6)$$

$$\Delta\theta_{roll} = |\theta_{roll,initial} - \theta_{roll,current}| \qquad (7)$$

$$\Delta\theta_{azimuth} = |\theta_{azimuth,initial} - \theta_{azimuth,current}| \qquad (8)$$

$$\Delta\theta_{elevation} = |\theta_{elevation,initial} - \theta_{elevation,current}| \qquad (9)$$

$$\Delta d = |d_{initial} - d_{current}| \qquad (10)$$

according to some embodiments. In some embodiments, filter manager 212 compares each of the differences (i.e., $\Delta\theta_{yaw}$, $\Delta\theta_{pitch}$, $\Delta\theta_{roll}$, $\Delta\theta_{azimuth}$, $\Delta\theta_{elevation}$, and $\Delta d$) to a corresponding threshold value. For example, filter manager 212 may compare each of the differences in position (i.e., $\Delta\theta_{azimuth}$, $\Delta\theta_{elevation}$, and $\Delta d$) to a corresponding positional change threshold $\Delta p_{thresh}$, or may individually compare each of the differences in position to a corresponding positional threshold such as $\Delta\theta_{azimuth,thresh}$, $\Delta\theta_{elevation,thresh}$, and $\Delta d_{thresh}$, respectively. Likewise, filter manager 212 may compare each of the differences in orientation (i.e., $\Delta\theta_{yaw}$, $\Delta\theta_{pitch}$, and $\Delta\theta_{roll}$) to a corresponding orientation change threshold $\Delta\theta_{thresh}$, or may individually compare each of the differences in orientation to a corresponding orientation change threshold such as $\Delta\theta_{yaw,thresh}$, $\Delta\theta_{pitch,thresh}$, and $\Delta\theta_{roll,thresh}$, respectively. If any of the differences (i.e., $\Delta\theta_{yaw}$, $\Delta\theta_{pitch}$, $\Delta\theta_{roll}$, $\Delta\theta_{azimuth}$, $\Delta\theta_{elevation}$, and $\Delta d$) exceed their corresponding or associated threshold, filter manager 212 may use the current orientation and/or position values to adjust, calibrate, update, etc., filter 218, and may provide the filter adjustments and/or the filter update to filter 218 to account for the new position and/or orientation of wearable device 102. Filter 218 may then operate with the adjustment and/or the calibration to generate filtered audio signals for speaker controller 220, which uses the filtered audio signals to operate speaker(s) 118.

Referring still to FIG. 2, controller 200 may include a filter 218 for various ones of speaker(s) 118. For example, memory 206 can include a first filter 218a and a second filter 218b. The first filter 218a may be associated with a first or a right speaker 118a, while the second filter 218b may be associated with a second or left speaker 118b. The right speaker 118a and the first filter 218a can be configured to equalize and provide sound output to the user's right ear 108, while the left speaker 118b and the second filter 218b can be configured to equalize and provide sound output to the user's left ear 108. In some embodiments, the first filter 218a and the second filter 218 are adjusted or defined independently of each other by filter manager 212. For example, filter manager 212 may be configured to receive sound data from a first microphone 120a that is proximate or adjacent the user's right ear 108 and a second microphone 120b that is proximate or adjacent the user's left ear 108. In some embodiments, filter manager 212 and/or frequency response manager 214 are configured to generate an initial configuration of first filter 218a and second filter 218b based on the sound data or the acoustic measurements received from first microphone 120a and second microphone 120b. Filter manager 212 may use a first adjustment model (e.g., a first set of values of the coefficients $\beta_0$, $\beta_1$, $\beta_2$, $\beta_3$, $\beta_4$, $\beta_5$, and $\beta_6$) for the first filter 218a associated with the user's right ear 108, and a second adjustment model (e.g., a second set of values of the coefficients $\beta_0$, $\beta_1$, $\beta_2$, $\beta_3$, $\beta_4$, $\beta_5$, and $\beta_6$) for the second filter 218b associated with the user's left ear 108.

In some embodiments, filter manager 212 adjusts or calibrates the first filter 218a and the second filter 218b independently of each other and provides the adjustments for first filter 218a and second filter 218b to first and second filters 218a-b. It should be understood that any of the techniques, functionality, etc., of frequency response manager 214, filter manager 212, filter 218, sensor manager 210, and speaker controller 220 as described herein above with reference to FIG. 2 may be implemented for two or more speaker(s) 118 such that each of the speaker(s) 118 operate according to an associated filter that is adjusted, calibrated, defined, initially configured, etc., independently of any other filters. In some embodiments, the multiple filters 218 are independently adjusted based on sensor signals received from an individual IMU 116. In some embodiments, the multiple filters 218 and the operation of the corresponding speaker 118 thereof are adjusted or calibrated using sensor signals received from an IMU 116 that corresponds to the specific speaker 118.

Figure 24:
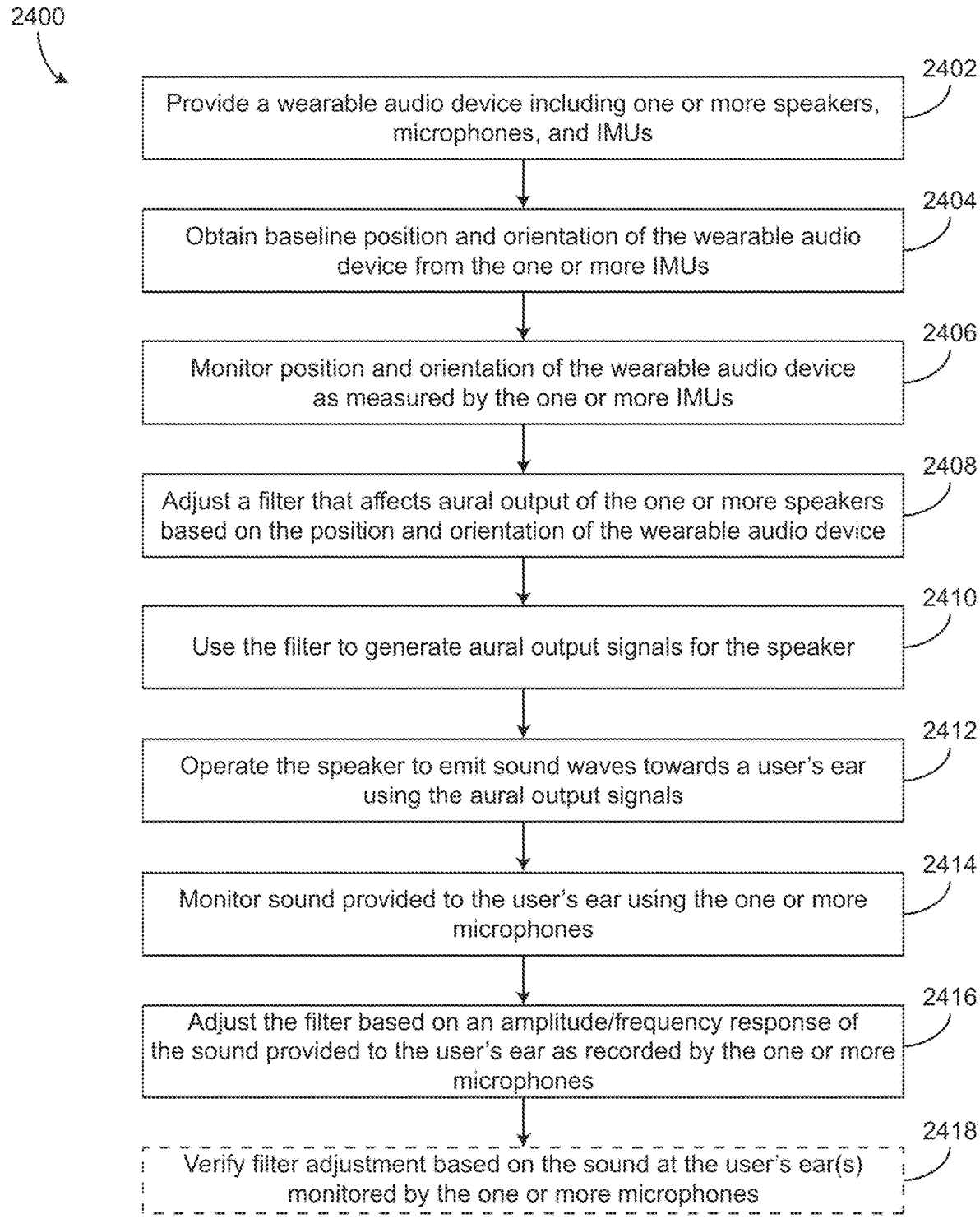
FIG. 24 is a flow diagram of a process for adjusting or calibrating a filter to account for changes in orientation and/or position of a wearable audio system, according to some embodiments.

Referring particularly to FIG. 24, a flow 2400 for providing calibrated or adjusted sound output to a user's ear is shown, according to some embodiments. In some embodiments, flow 2400 includes operations 2402-2418 and may be performed by controller 200 or by any other processing unit, computer, controller, etc., of a wearable audio output system (e.g., audio output system 100). Flow 2400 may advantageously use positional and/or orientation data of the wearable audio output system to calibrate or adjust a filter for improved audio/sound output.

Flow 2400 includes providing a wearable audio device including one or more speakers, microphones, and IMU(s) (operation 2402), according to some embodiments. In some embodiments, the wearable audio device is a wearable display device such as augmented, mixed, or virtual reality goggles, glasses, head mounted device, visor, etc. In some embodiments, the wearable audio device is the same as or similar to audio output system 100 or wearable device 102. The speakers may be configured to output sound or audio to a user's ear that wears the wearable audio device. The microphones may be configured to record, measure, monitor, sense, detect, etc., the sound output at the user's ear. The IMU(s) can be configured to measure orientation and/or position of the wearable audio device. In some embodiments, the IMU(s), the speakers, and the microphones are positioned along temple arms or structural members of the wearable audio device. The wearable audio device can also include a controller (e.g., controller 200) that is communicably coupled with the speakers, the microphones, and the IMUs.

Flow 2400 includes obtaining a baseline position and orientation of the wearable audio device from the one or more IMUs (operation 2404), according to some embodiments. In some embodiments, operation 2404 includes obtaining or receiving measurements of the wearable audio device from the one or more IMUs for a baseline or initial position/orientation of the wearable audio device. Operation 2404 may be performed by sensor manager 210. Operation 2404 can also include generating a filter with an initial configuration based on the initial position/orientation of the wearable audio device. In some embodiments, operation 2404 also includes determining a relative position/orientation between the wearable audio device and the user's head. In some embodiments, the relative position/orientation between the wearable audio device and the user's head is determined using sensor feedback from the IMUs and image data received from an imaging device of the wearable audio device (e.g., using a neural network, or machine learning in combination with computer vision).

Flow 2400 includes monitoring the position and orientation of the wearable audio device as measured by the one or more IMUs (operation 2406), according to some embodiments. In some embodiments, the position and orientation of the wearable audio device is obtained by sensor manager 210 from IMU(s) 116. In some embodiments, the position and orientation of the wearable audio device includes a yaw angle $\theta_{yaw}$, a roll angle $\theta_{roll}$, a pitch angle $\theta_{pitch}$, an azimuth $\theta_{azimuth}$, an elevation $\theta_{elevation}$, and a distance d. The position and orientation of the wearable audio device can be obtained in real-time by the controller 200, or may be received/obtained at scheduled intervals.

Flow 2400 includes adjusting a filter that affects aural output of the one or more speakers based on the position and orientation of the wearable audio device (operation 2408), according to some embodiments. In some embodiments, operation 2408 includes determining or calculating an adjustment for filter 218 using an adjustment model. The adjustment model may be a pre-defined model or may be generated based on received sound data, or may be updated, modified, etc., in real-time based on received sound data. In some embodiments, operation 2408 is performed by sensor manager 210 and filter manager 212. In some embodiments, filter manager 212 uses an adjustment model (e.g., shown in Equation (1) above) to determine an adjustment or calibration for filter 218 using the position and/or orientation of the wearable audio device. In some embodiments, the filter is an equalization filter. Operation 2408 can include generating a calibration or adjustment for the filter to account for changes in the position and/or orientation of the wearable audio device to provide a generally flat frequency response or any other desired frequency response (e.g., to maintain a desired sound output frequency/amplitude response despite changes to position and/or orientation). In some embodiments, operation 2408 is performed in response to current position/orientation of the wearable audio device (as obtained in operation 2406) deviating from the baseline or initial position/orientation of the wearable audio device by at least a threshold amount.

Flow 2400 includes using the filter to generate aural output signals for the speaker (operation 2410), according to some embodiments. In some embodiments, operation 2410 is performed by filter 218 and speaker controller 220. The aural output signals may be generated, calibrated, or adjusted, using the filter 218 to account for changes in a transfer function that occurs due to changes in the position and/or orientation of the wearable audio device (e.g., relative to the user's head).

Flow 2400 includes operating the speaker to emit sound waves towards a user's ear using the aural output signals (operation 2412), according to some embodiments. In some embodiments, operation 2412 is performed by speaker controller 220 and speaker(s) 118. In some embodiments, speaker controller 220 receives filtered audio signals or filtered aural output signals from filter 218 and outputs audio output signals to speaker(s) 118 to perform operation 2412.

Flow 2400 includes monitoring sound provided to the user's ear using the one or more microphones (operation 2414), according to some embodiments. In some embodiments, the microphones are positioned proximate the users ear so that the microphones can obtain sound data that is indicative of what the user hears. In some embodiments, operation 2414 is performed by frequency response manager 214. In some embodiments, if the adjustment model used in operation 2408 is generated as a part of flow 2400 or is modified, updated, adjusted, etc., as a part of flow 2400, operation 2414 may be performed to obtain sound data from the microphones.

Flow 2400 includes adjusting the filter based on an amplitude/frequency response of the sound provided to the user's ear as recorded by the one or more microphones (operation 2416), according to some embodiments. In some embodiments, the adjustment model is updated based on the amplitude/frequency response of the sound provided to the user's ear. In some embodiments, operation 2416 is performed by frequency response manager 214 and filter manager 212. In some embodiments, operation 2416 includes recording a current value of the position/orientation of the wearable audio device and a current amplitude of sound output at a plurality of frequencies. In some embodiments, operation 2416 includes updating, adjusting, generating, defining, etc., coefficients of the adjustment model using a relationship (e.g., results from performing a regression technique) between the position/orientation of the wearable audio device and the amplitude of sound output at a particular or at a plurality of frequencies.

Flow 2400 includes verifying the filter adjustment based on the sound at the user's ear(s) monitored by the one or more microphones (operation 2418), according to some embodiments. In some embodiments, operation 2418 is performed by frequency response manager 214 and filter manager 212. For example, frequency response manager 214 may receive sound data from microphone 120 and generate a frequency response (e.g., sound amplitude versus frequency) of the sound data. In some embodiments, filter manager 212 and/or frequency response manager 214 can determine if the frequency response matches a desired frequency response (e.g., a flat response) and may adjust filter 218 in response to the frequency response not matching the desired frequency response.

It should be understood that flow 2400 may be performed to adjust, calibrate, define, etc., multiple filters of the wearable audio device. For example, the wearable audio device may include multiple speakers, multiple IMUS, multiple filters, etc., for the user's left and right ears. Flow 2400 may be performed to adjust the filters and the sound output to the user's left and right ears independently of each other to thereby provide a tailored sound output to each of the user's ears. In this way, a desired frequency response (e.g., a flat response) can be achieved for the multiple speakers/filters by performing flow 2400 to independently adjust the filters and sound output by the speakers.

Referring particularly to FIGS. 6-9, graph 600 shows sound amplitude (in dB) with respect to frequency (Hz), and graph 700 shows corresponding standard deviation of graph 600 (in dB) with respect to frequency (Hz) for a user's left ear (represented by series 702), according to some embodiments. Graph 600 includes multiple series 602 that each demonstrate the frequency response of the sound output by speaker 118 at the user's left ear 108 for a different position/orientation of wearable device 102. Specifically, graph 600 includes N=387 series 602 corresponding to 387 different fits (e.g., position/orientation) of wearable device 102. Graphs 800 and 900 show similar results but for a user's right ear, according to some embodiments. Specifically, graph 800 includes multiple series 802 showing sound amplitude (in dB) with respect to frequency (Hz) for the same positions/orientations of wearable device 102 as shown in graph 600. Graph 900 includes series 902 that shows standard deviation (in dB) with respect to a same frequency axis (Hz) for the multiple series 802.

Figure 6:
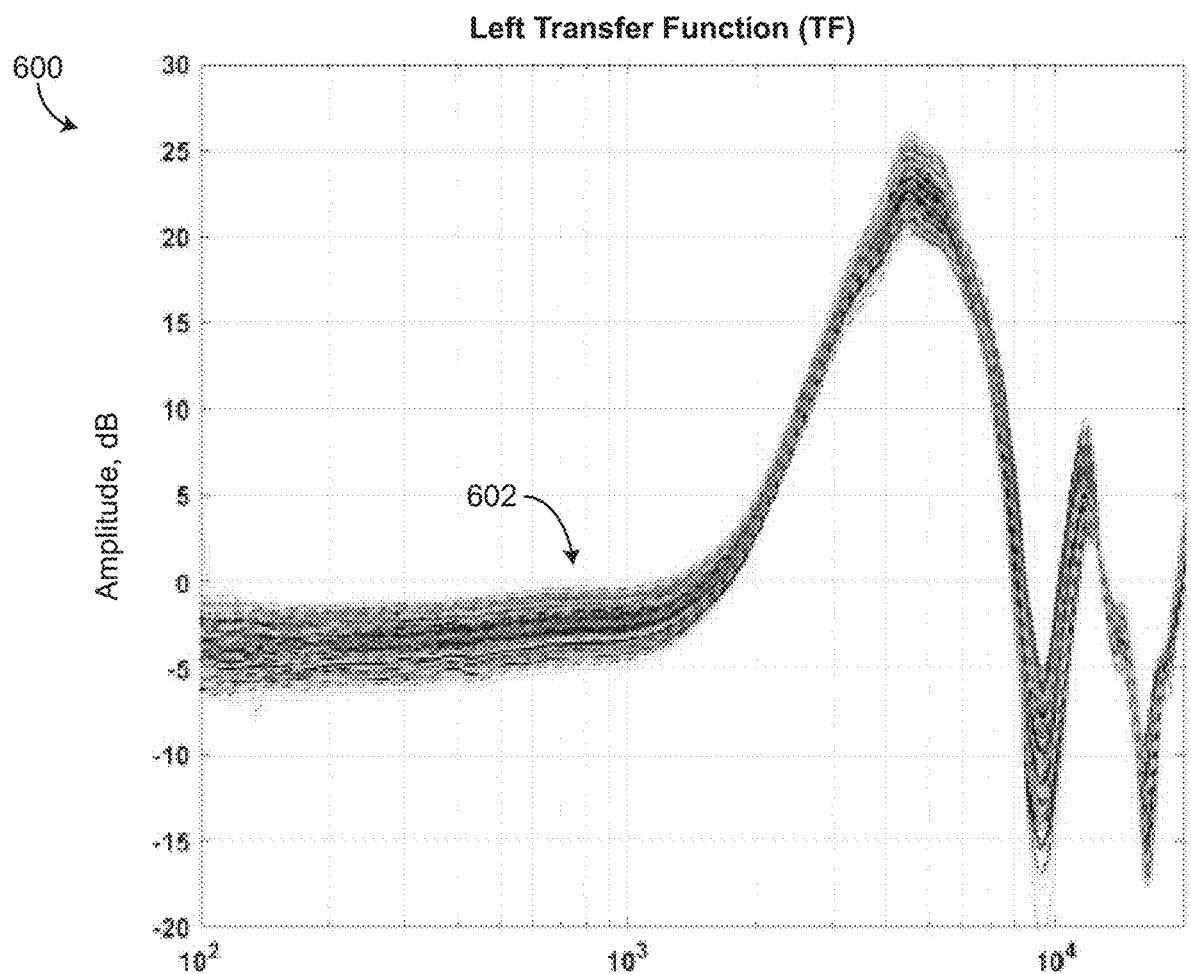
FIG. 6 is a graph of sound amplitude versus frequency of a left-ear speaker of the wearable audio system of FIG. 1, demonstrating the impact of different orientations/positions of the wearable audio system of FIG. 1, according to some embodiments.
Figure 7:
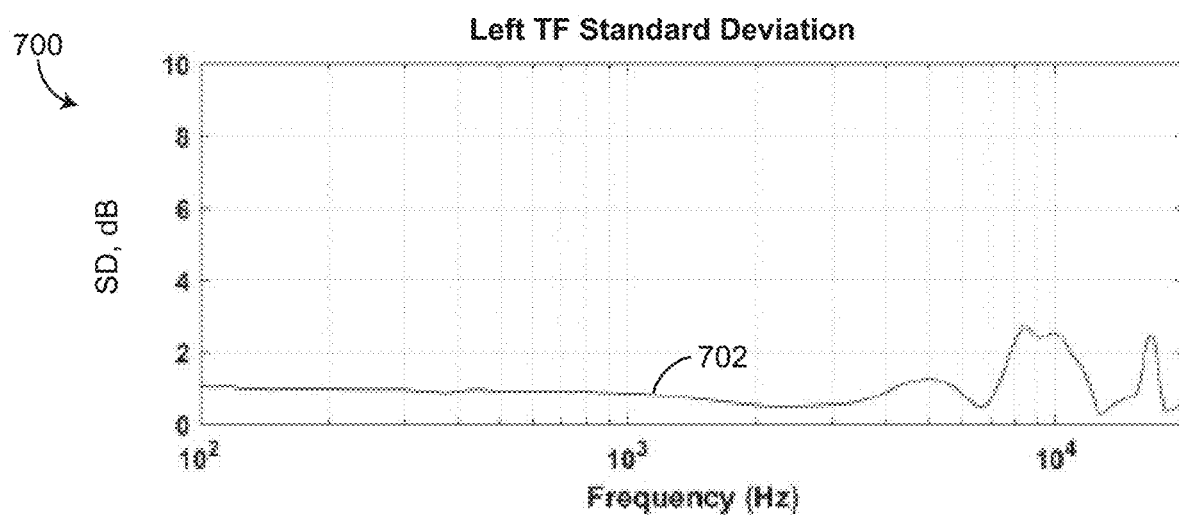
FIG. 7 is a graph of a standard deviation of the sound amplitude versus frequency of FIG. 6, according to some embodiments.
Figure 8:
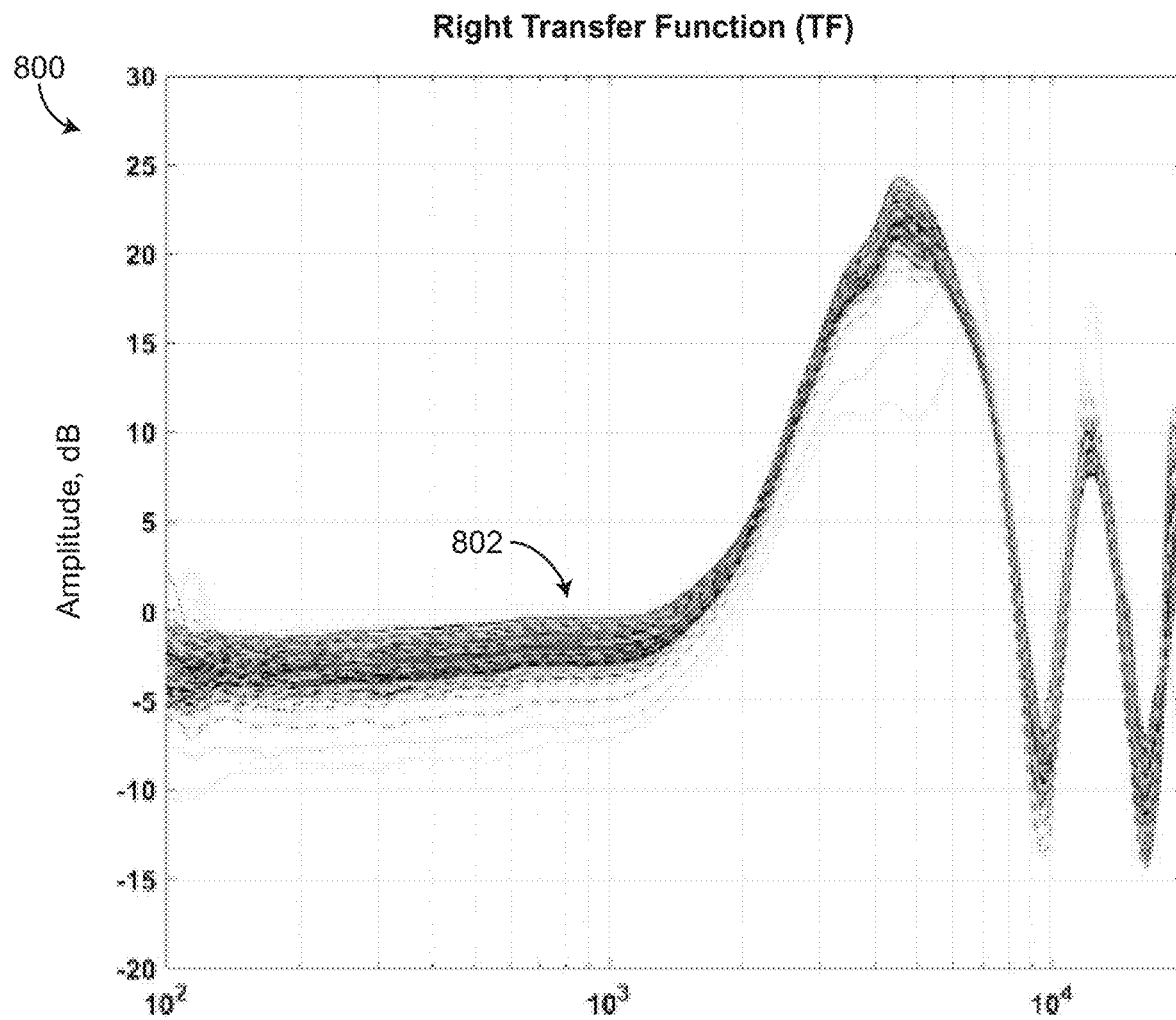
FIG. 8 is a graph of sound amplitude versus frequency of a right-ear speaker of the wearable audio system of FIG. 1, demonstrating the impact of different orientations/positions of the wearable audio system of FIG. 1, according to some embodiments.
Figure 9:
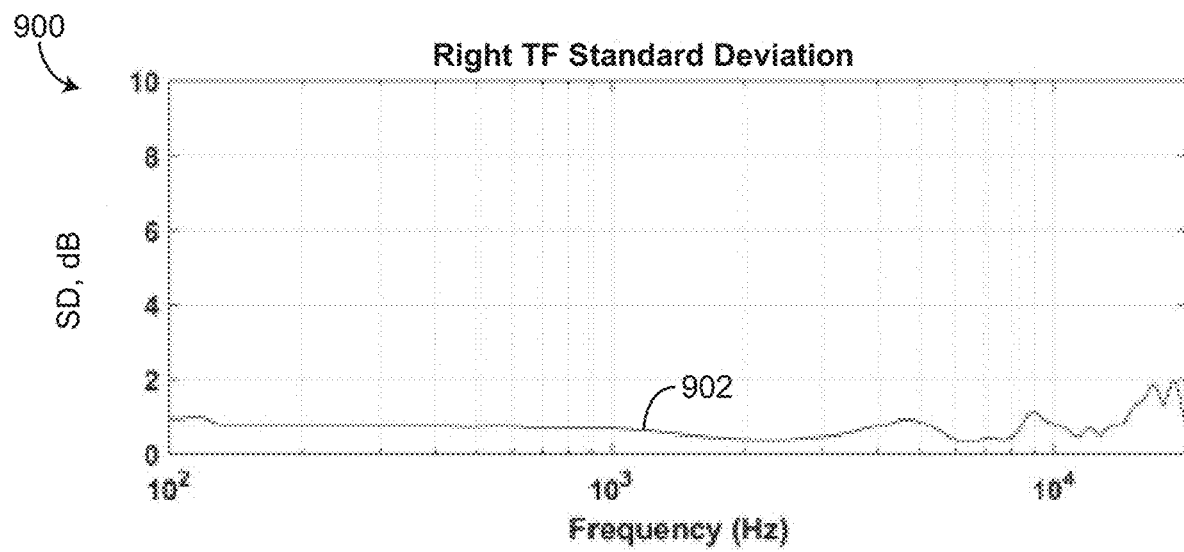
FIG. 9 is a graph of a standard deviation of the sound amplitude versus frequency of FIG. 9, according to some embodiments.
Figure 10:
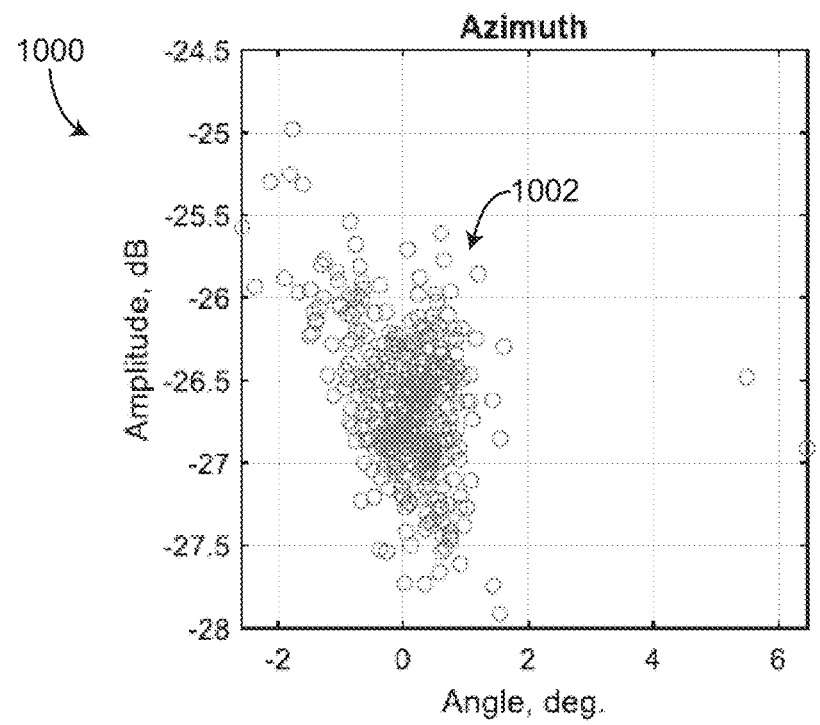
FIG. 10 is a graph of sound amplitude versus azimuth of the wearable audio system of FIG. 1 for a particular frequency, according to some embodiments.
Figure 11:
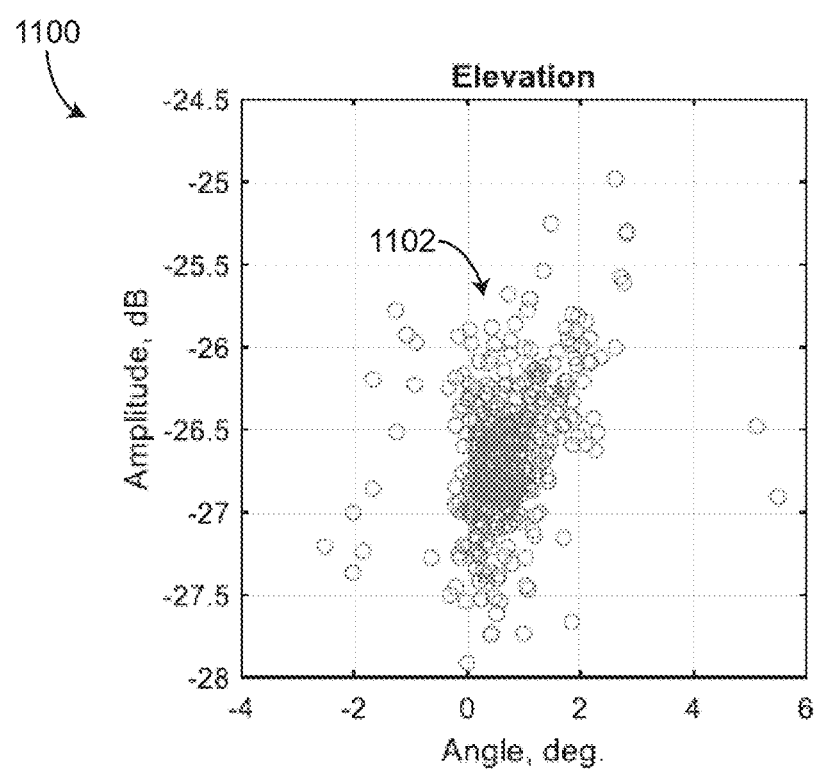
FIG. 11 is a graph of sound amplitude versus elevation of the wearable audio system of FIG. 1 for a particular frequency, according to some embodiments.
Figure 12:
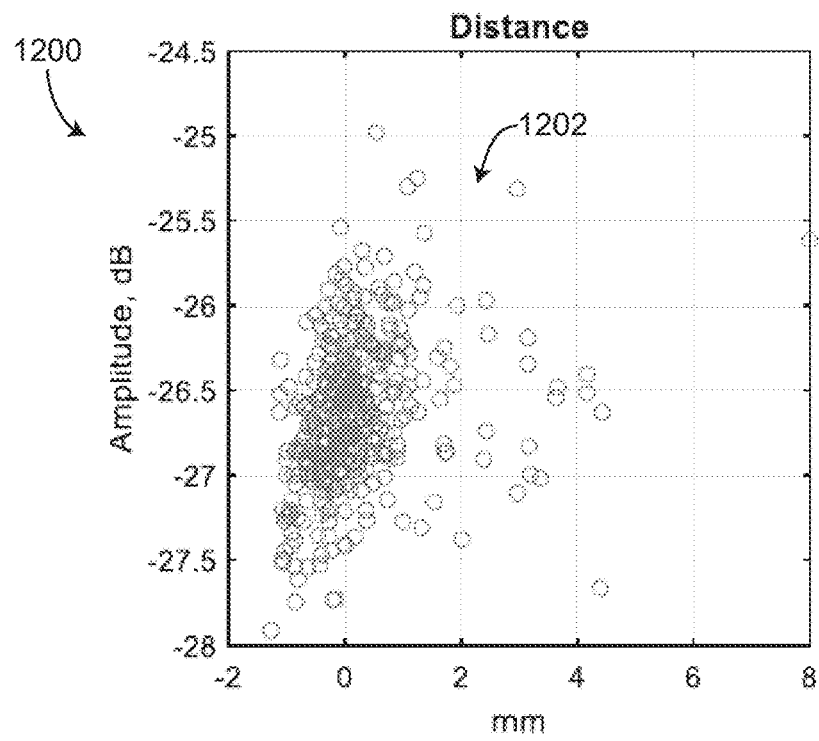
FIG. 12 is a graph of sound amplitude versus distance of the wearable audio system of FIG. 1 for a particular frequency, according to some embodiments.
Figure 13:
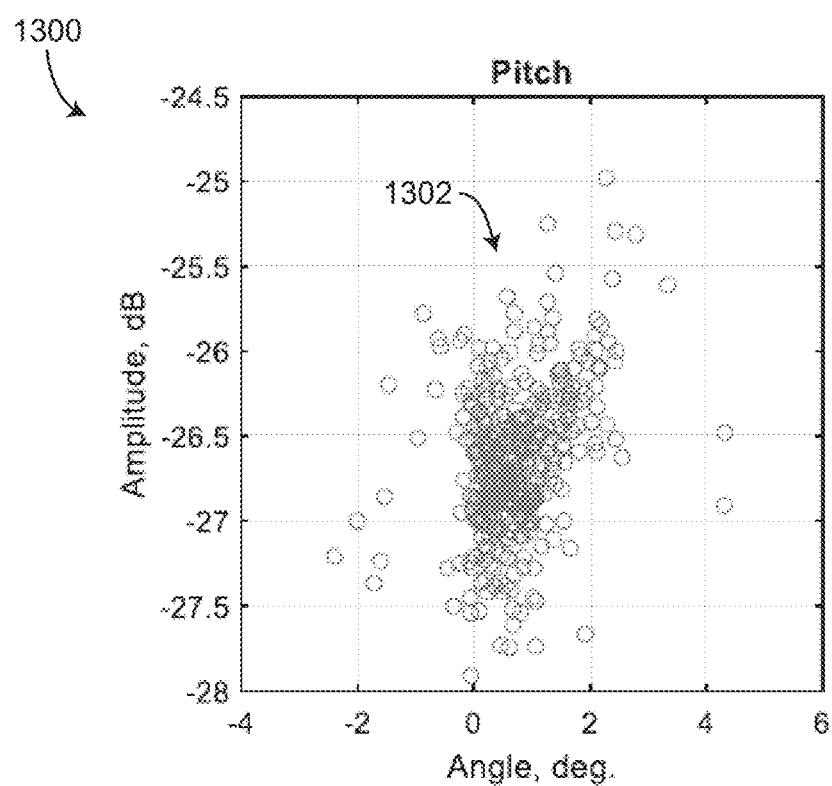
FIG. 13 is a graph of sound amplitude versus pitch of the wearable audio system of FIG. 1 for a particular frequency, according to some embodiments.
Figure 14:
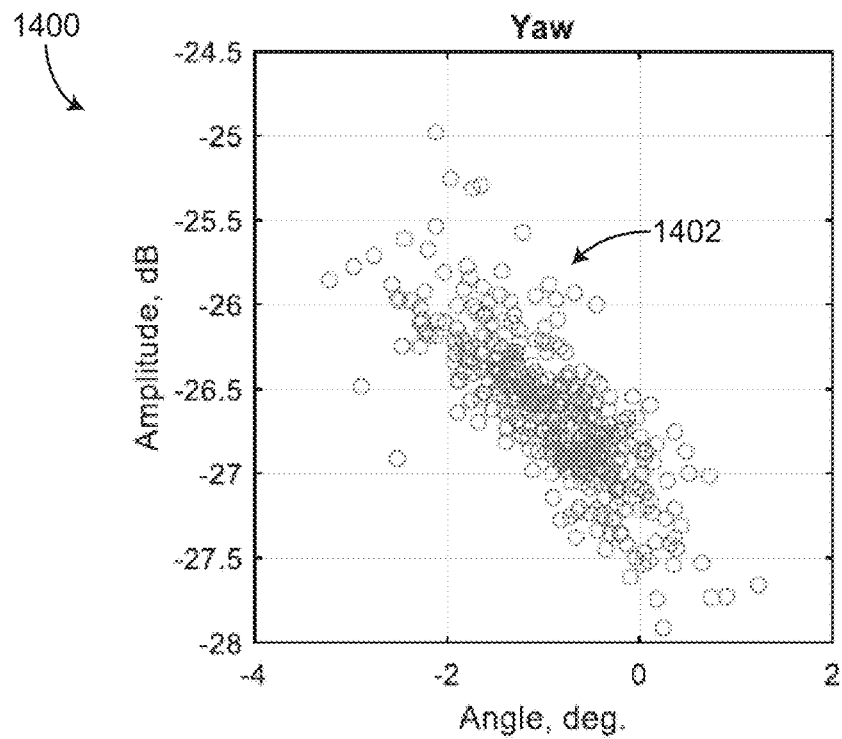
FIG. 14 is a graph of sound amplitude versus yaw of the wearable audio system of FIG. 1 for a particular frequency, according to some embodiments.
Figure 15:
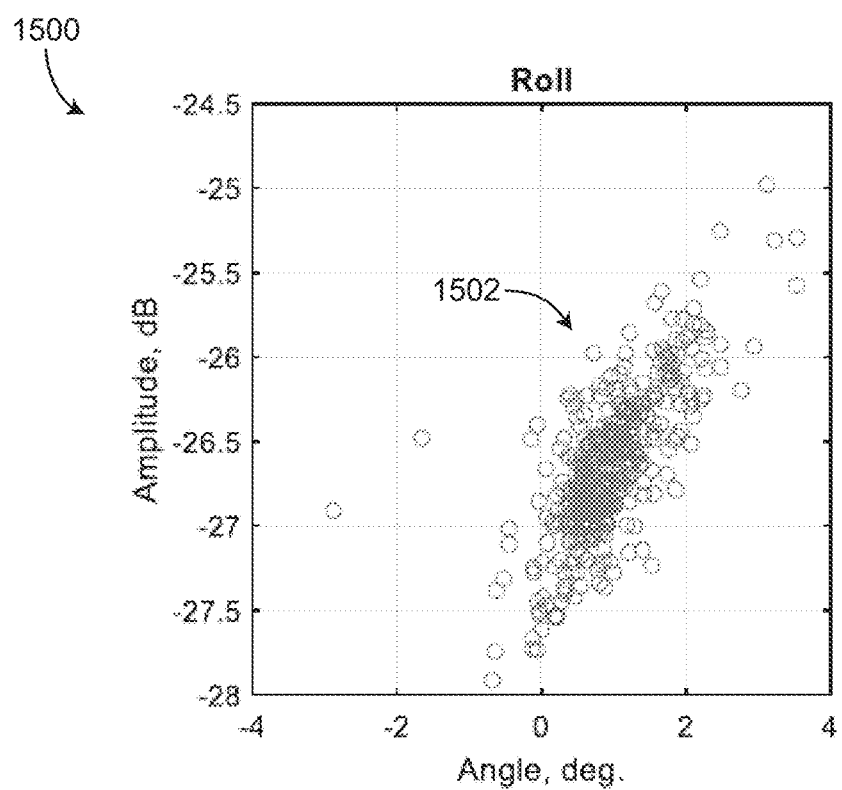
FIG. 15 is a graph of sound amplitude versus roll of the wearable audio system of FIG. 1 for a particular frequency, according to some embodiments.

As shown in FIGS. 6 and 8, the frequency response at the user's left ear and the user's right ear (i.e., the transfer function) may have a similar shape, but may differ. Advantageously, the systems and methods described herein may independently adjust filters for the speakers 118 of the user's left and right ears 108 to independently equalize the sound provided to the user's left and right ears 108, or to independently operate the speakers 118 to achieve a desired frequency response at the user's left and right ears. As shown in graphs 700 and 900 of FIGS. 7 and 9, higher frequencies may be associated with higher standard deviations. The filter 218 may adjust sound output based on changes in position/orientation of wearable device 102 to reduce the standard deviation that results from shifts in the position/orientation of wearable device 102.

Figure 16:
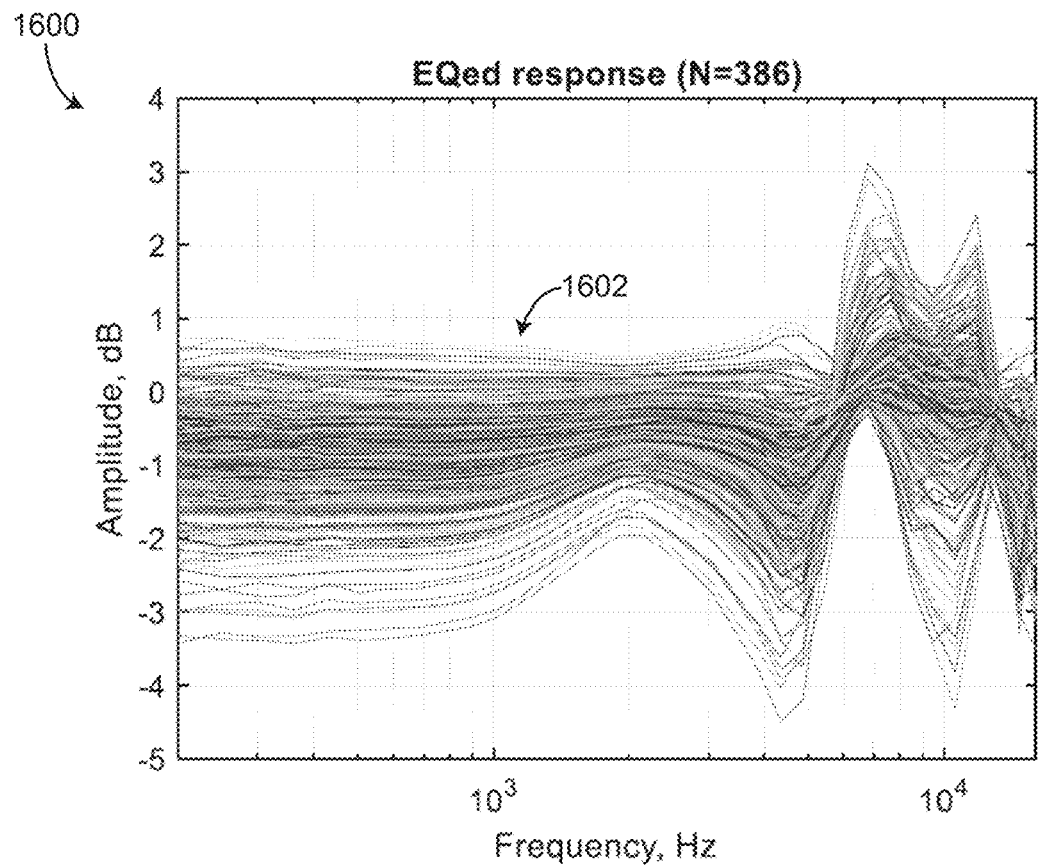
FIG. 16 is a graph of an equalized sound output versus frequency of the wearable audio system of FIG. 1, according to some embodiments.
Figure 18:
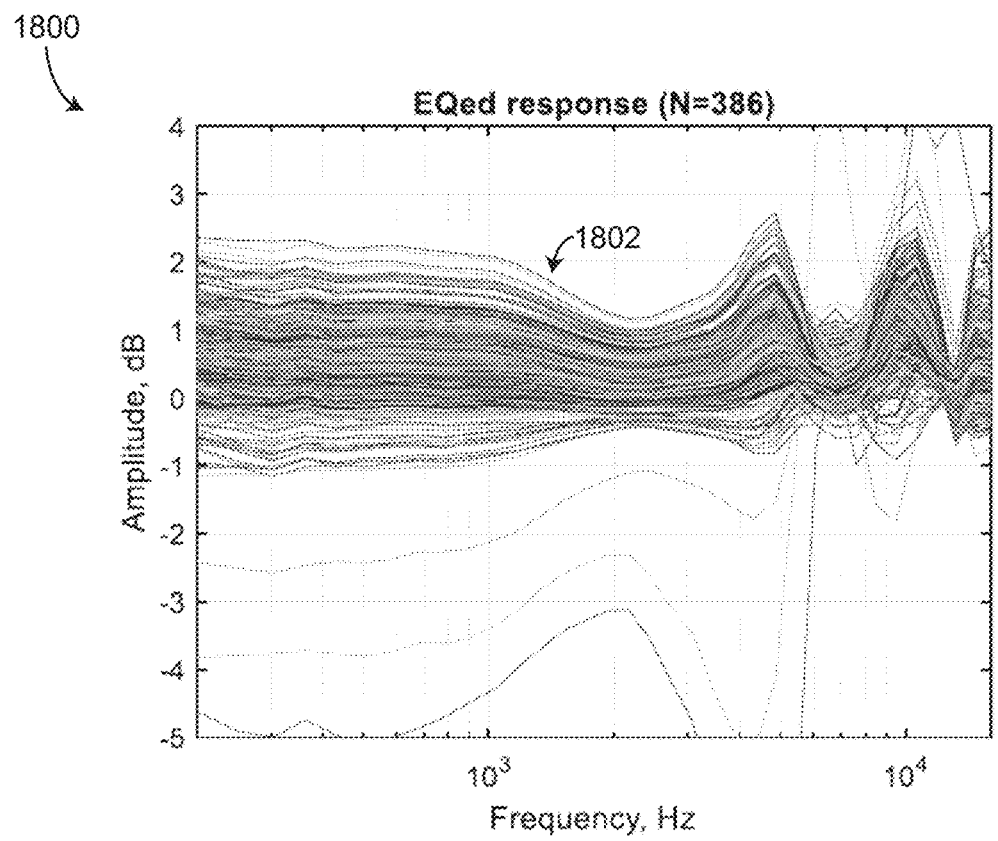
FIG. 18 is a graph of an equalized sound output versus frequency of the wearable audio system of FIG. 1, according to some embodiments.

Referring particularly to FIGS. 16 and 18, graphs 1600 and 1800 show equalized responses (e.g., sound amplitude in dB shown on the Y-axis, with respect to frequency in Hz along the X-axis) that do not account for changes in position/orientation of wearable device 102. As shown in FIGS. 16 and 18, graphs 1600 and 1800 include multiple series 1602 and 1802 which each demonstrate amplitude versus frequency for a different fit (e.g., a different position/orientation) of wearable device 102. As shown in FIGS. 16 and 18, the amplitude deviates based on the different fits of wearable device 102.

Figure 17:
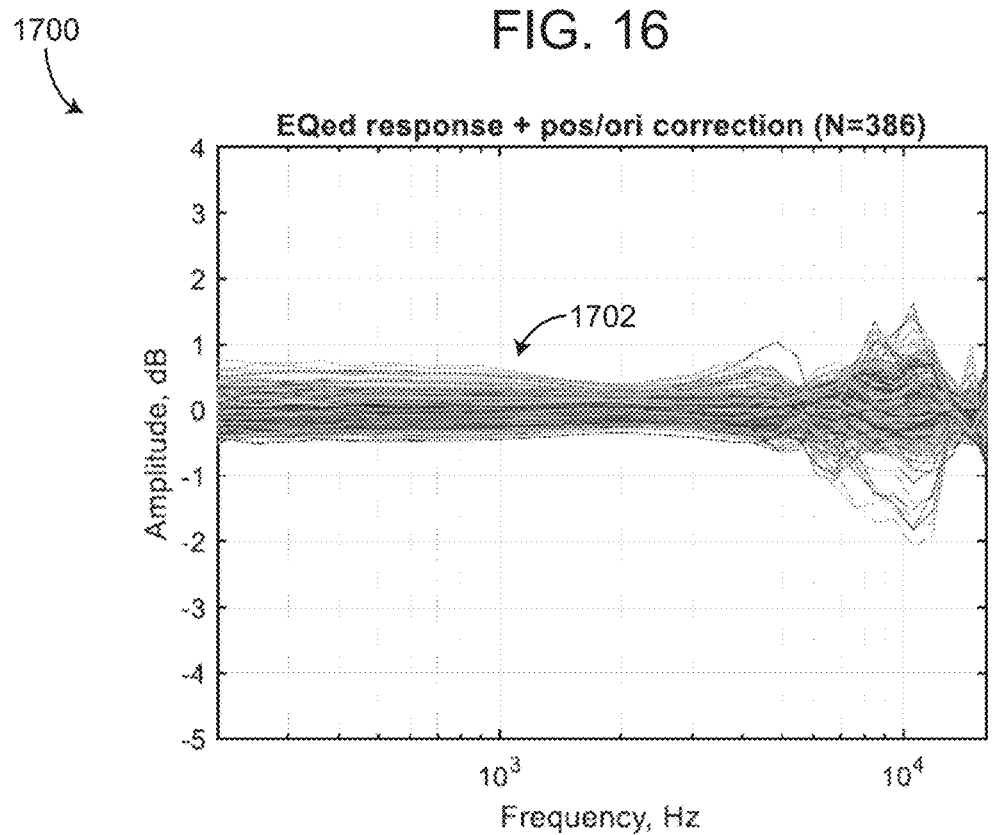
FIG. 17 is a graph of the equalized sound output versus frequency of FIG. 16 with adjustments to account for orientation/position of the wearable audio system of FIG. 1, according to some embodiments.
Figure 19:
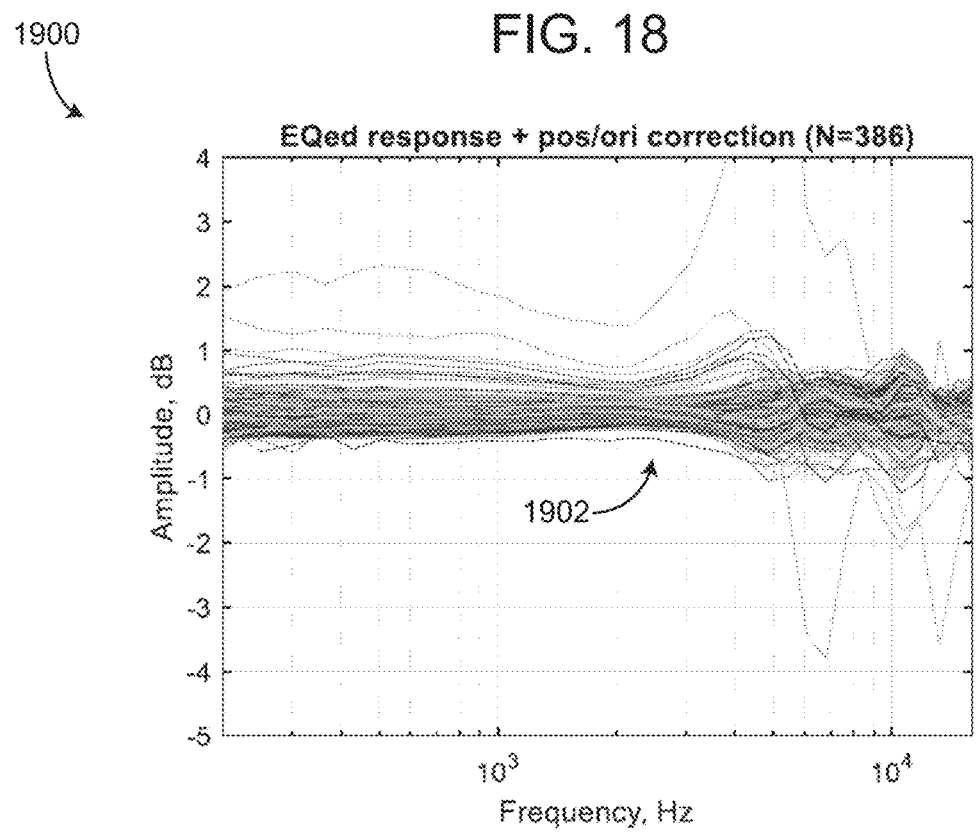
FIG. 19 is a graph of the equalized sound output versus frequency of FIG. 18 with adjustments to account for orientation/position of the wearable audio system of FIG. 1, according to some embodiments.

Referring particularly to FIGS. 17 and 19, graphs 1700 and 1900 correspond to graphs 1600 and 1900, respectively, and show sound amplitude (the Y-axis) with respect to frequency (the X-axis) for 386 different fits of wearable device 102 (e.g., 386 different positions/orientations of wearable device 102). However, graphs 1700 and 1900 show when filter 218 is adjusted, calibrated, etc., by filter manager 212 to account for position/orientation changes of wearable device 102. As shown in FIGS. 16-19, using filter 218 with compensation or adjustment/calibration that accounts for position/orientation of wearable device 102 may reduce the deviation of the sound amplitude. Specifically, graphs 1600 and 1800 show that the sound amplitude may deviate up to 5 dB when filter 218 does not account for changes in the position/orientation of wearable device 102. However, when filter 218 is calibrated or adjusted to account for changes in the position/orientation of wearable device 102 (using the techniques or systems and methods described herein), the deviation of the sound amplitude is reduced.

Figure 22:
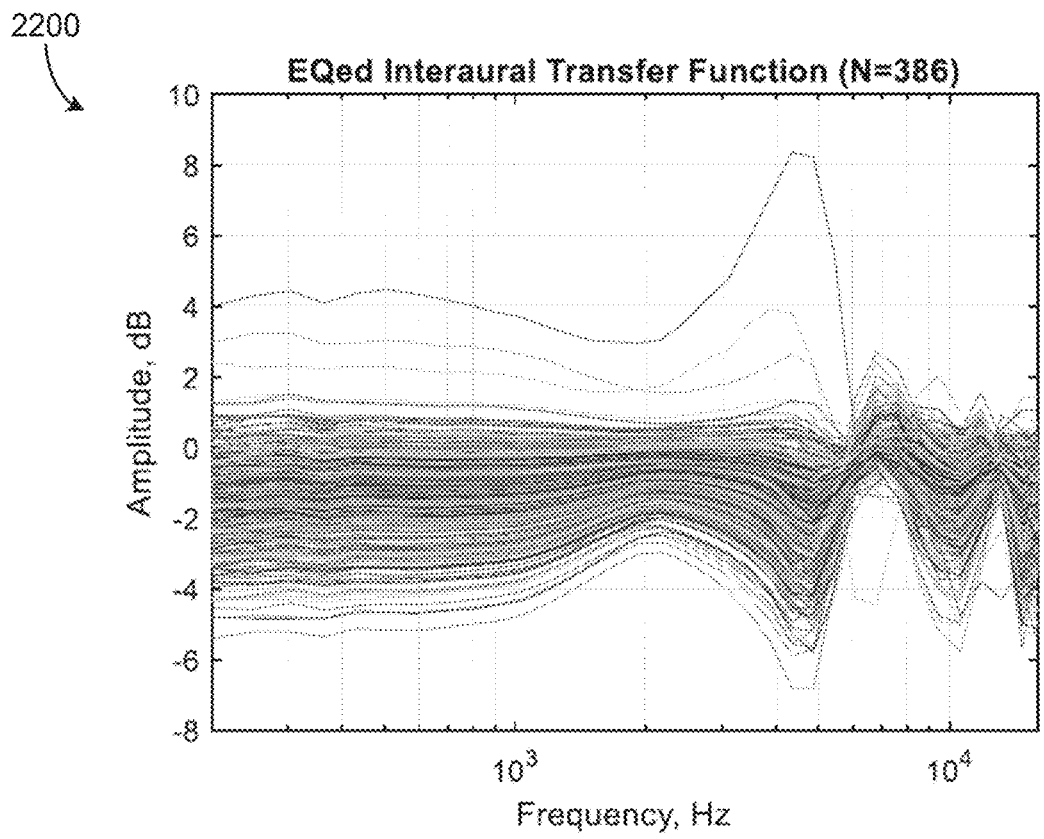
FIG. 22 is a graph of an equalized sound output versus frequency of the wearable audio system of FIG. 1, according to some embodiments.
Figure 23:
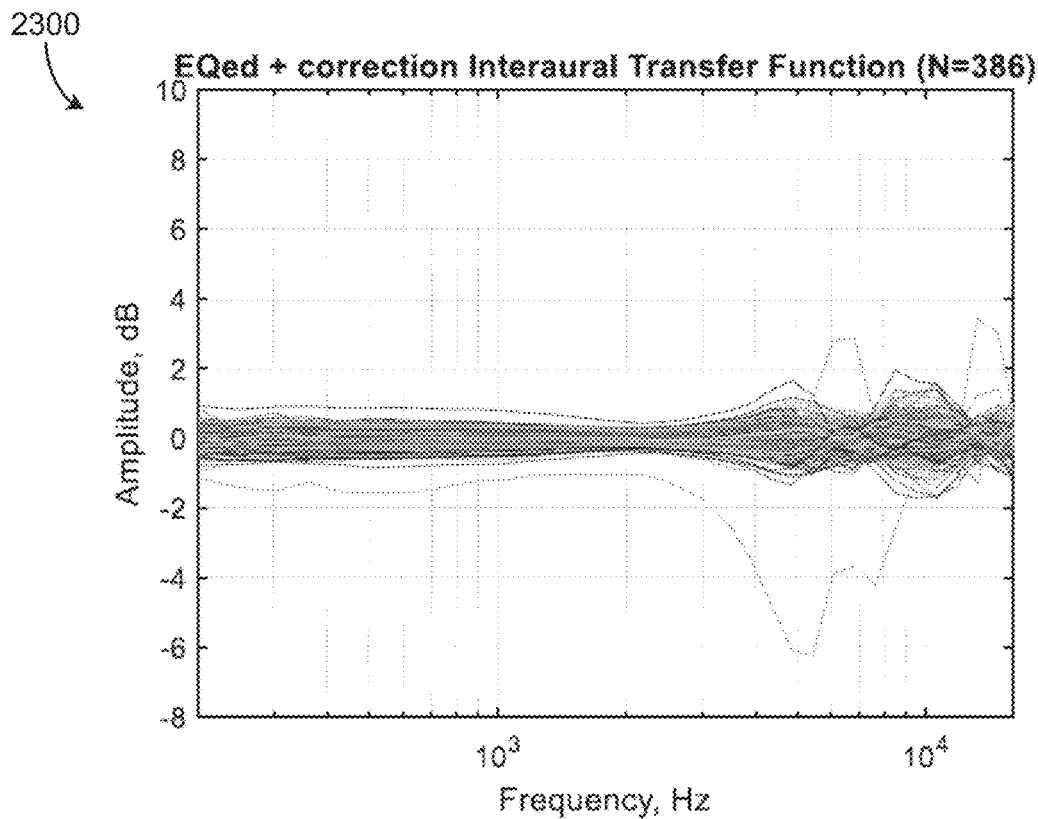
FIG. 23 is a graph of the equalized sound output versus frequency of FIG. 22 with adjustments to account for orientation/position of the wearable audio system of FIG. 1, according to some embodiments.

Referring particularly to FIGS. 22 and 23, graphs 2200 and 2300 show another test result demonstrating the effect that changes in the position/orientation of wearable device 102 may have on sound amplitude (for N=386 different fits) and the advantages of using filter 218 while accounting for changes in the position/orientation of wearable device 102. Similar to graphs 1600, 1700, 1800, and 1900 as shown in FIGS. 16-19 and described in greater detail above, filter 218 is shown to reduce deviation in the amplitude.

Figure 20:
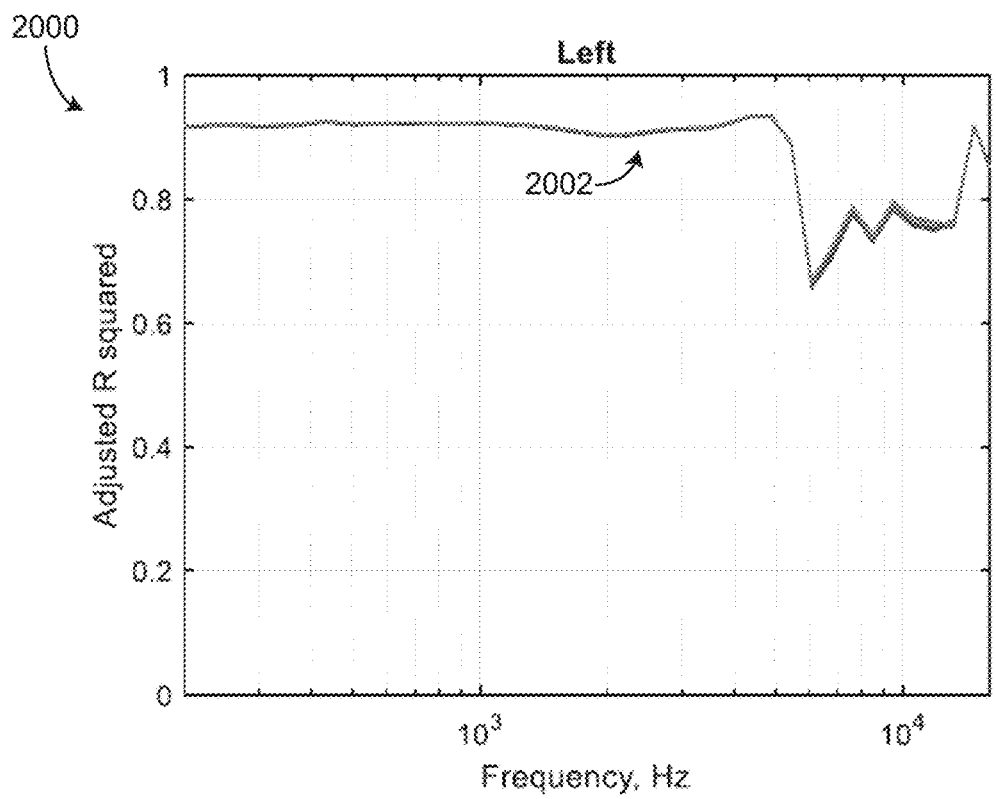
FIG. 20 is a graph of an adjusted R-squared with respect to frequency of a model used by the wearable audio system of FIGS. 1-2 for a left-ear speaker, according to some embodiments
Figure 21:
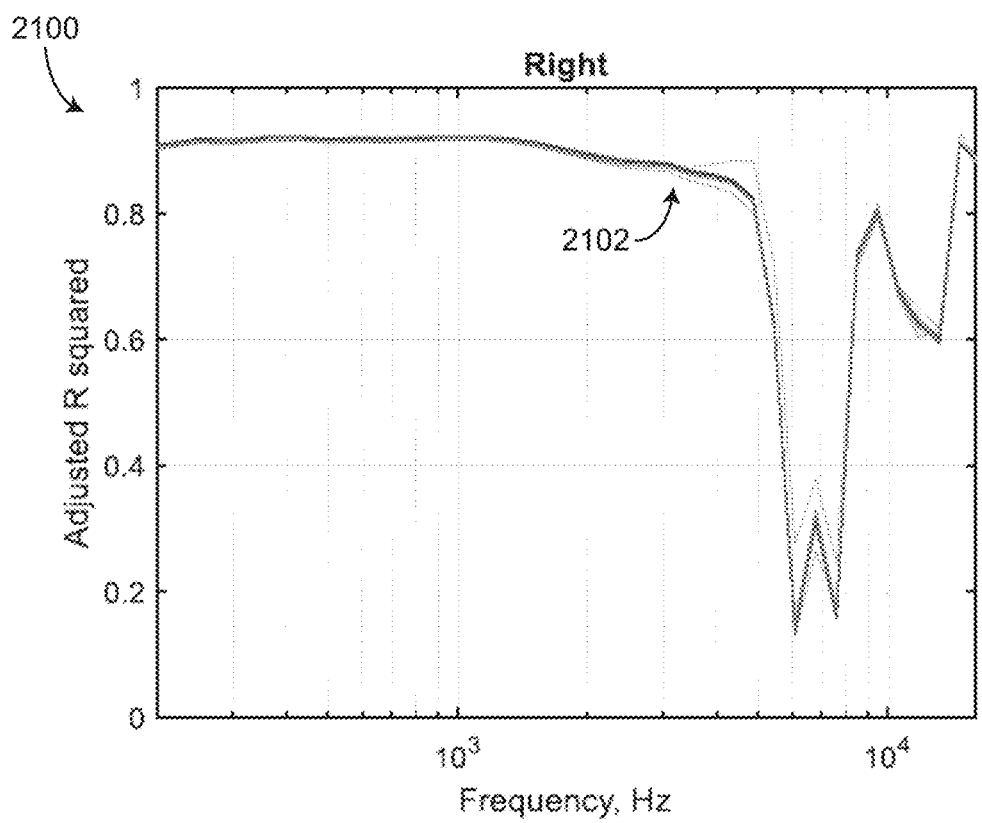
FIG. 21 is a graph of an adjusted R-squared with respect to frequency of a model used by the wearable audio system of FIGS. 1-2 for a right-ear speaker, according to some embodiments

Referring particularly to FIGS. 20 and 21, graphs 2000 and 2100 demonstrate an adjusted R-squared value of the transfer function or the adjustment model used by controller 200, according to some embodiments. Graph 2000 demonstrates the adjusted R-squared value of the model used by controller 200 (with respect to frequency) for a left-ear speaker 118, while graph 2100 demonstrates the adjusted R-squared value of the model used by controller 200 (with respect to frequency) for a right-ear speaker 118, according to some embodiments. Graph 2000 includes multiple series 2002, which each show the adjusted R-squared value with respect to frequency for a different orientation/position of wearable device 102. Likewise, graph 2100 includes multiple series 2102 which each show the adjusted R-squared value with respect to frequency for a different orientation/ position of wearable device 102. As shown in graphs 2000 and 2100, the adjusted R-squared value of the adjustment model used by filter manager 212 has a correlation at or above 0.9 at lower frequencies and an adjusted R-squared value that is lower at higher frequencies. This many indicate that the filter 218 and filter manager 212 are more efficacious at lower frequencies compared to higher frequencies.

B. Alternative Implementations of At-Ear Calibration Systems

Figure 25:
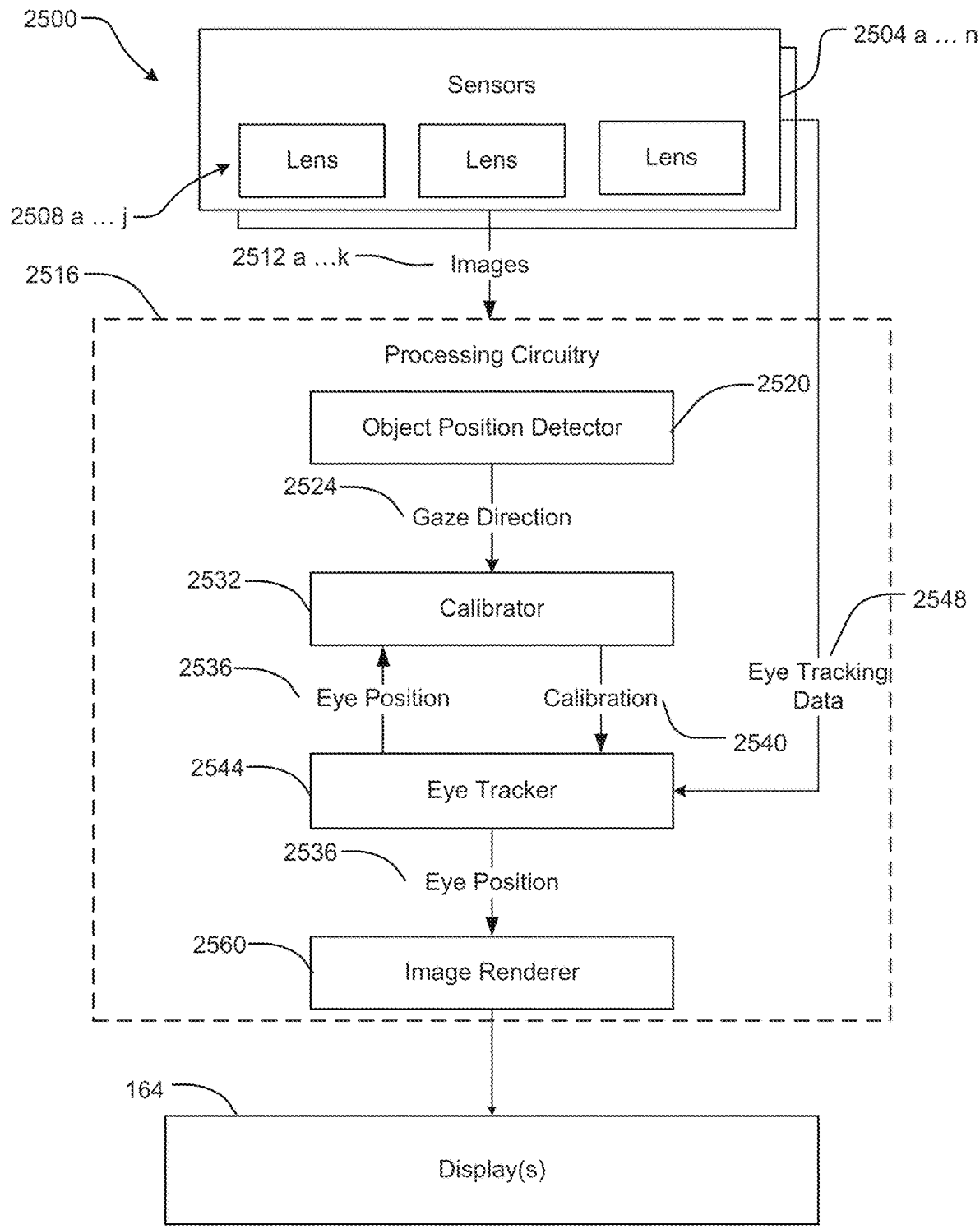
FIG. 25 is a block diagram of a display system that can be configured to perform any of the functionality of the wearable audio system of FIGS. 1-2 or the process of FIG. 24, according to some embodiments.
Figure 26:
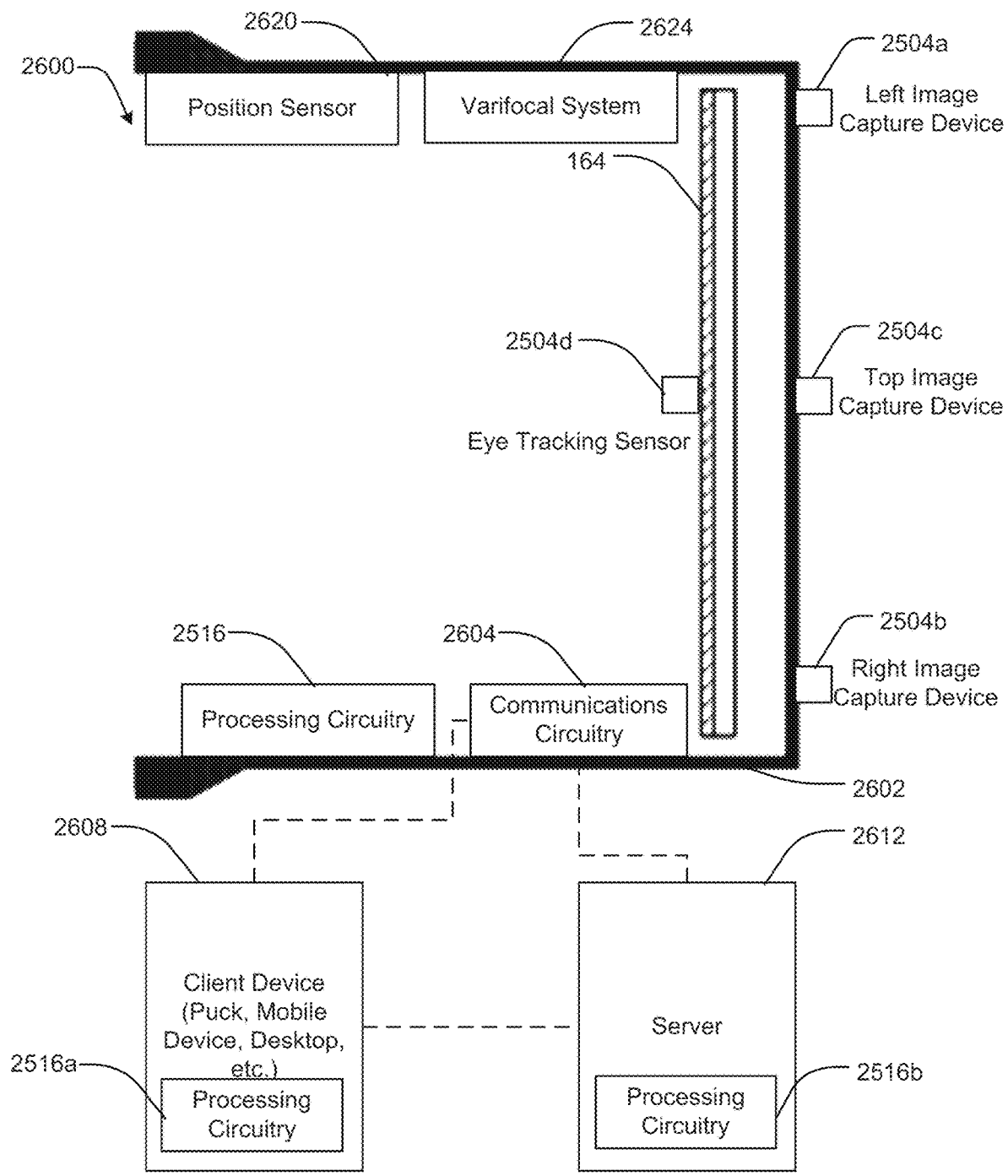
FIG. 26 is a schematic diagram of a head-mounted display (HMD) system, according to some embodiments.
Figure 27:
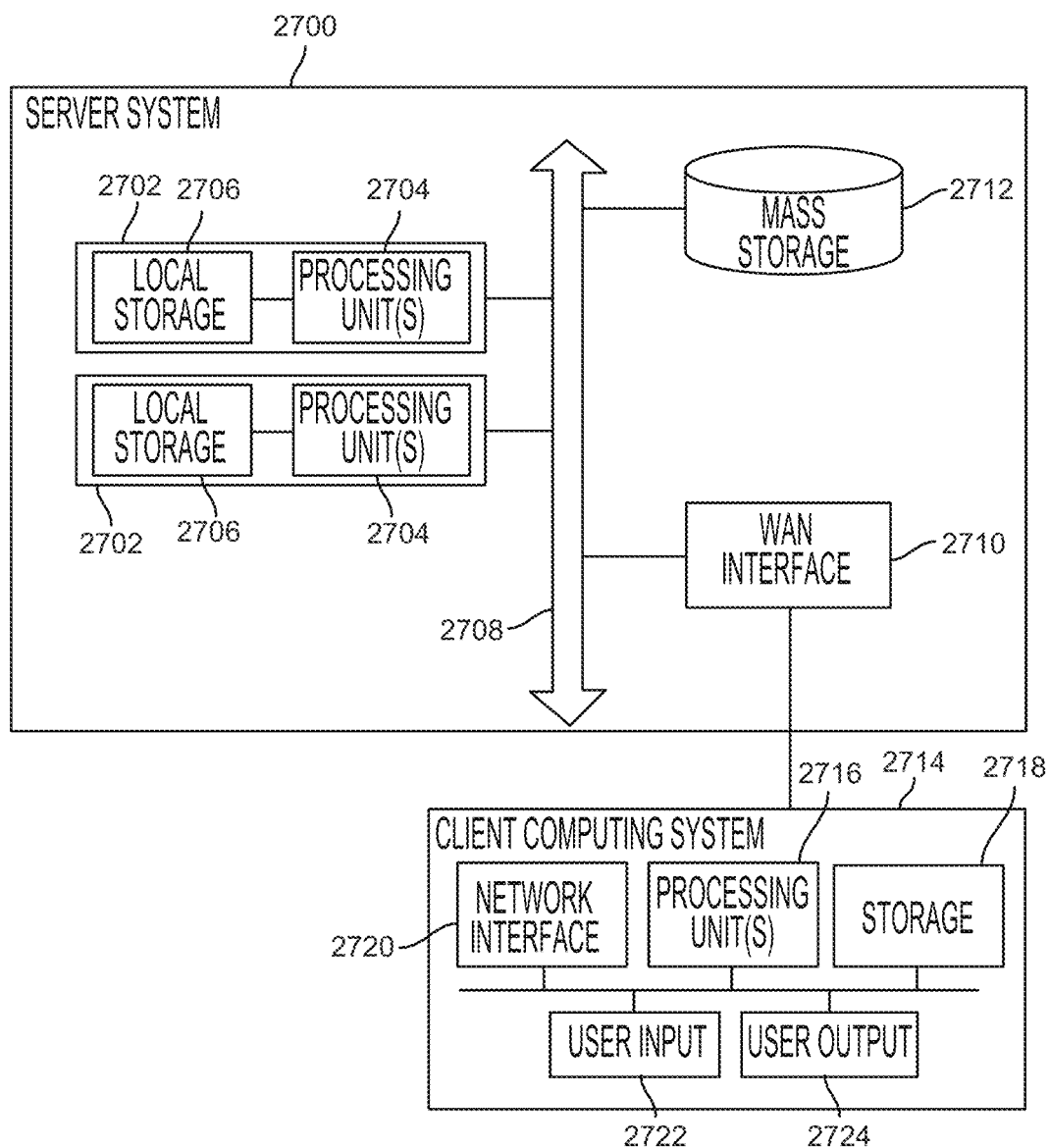
FIG. 27 is a block diagram of a computing environment that can be configured to perform any of the functionality of the wearable audio system of FIGS. 1-2 or the process or FIG. 24 or the HMD system of FIG. 26, according to some embodiments.

Referring now to FIGS. 25-27, various computing environments and embodiments of audio output system 100 are shown. Referring particularly to FIG. 25, a system 2500 can include a plurality of sensors 2504a ... n, processing circuitry 2516, and one or more displays 164. In some embodiments, processing circuitry 2516 is configured to perform any of the functionality of controller 200 as described in greater detail above. The system 2500 can be implemented using the HMD system 2600 described with reference to FIG. 26. The system 2500 can be implemented using the computing environment described with reference to FIG. 27. The system 2500 can incorporate features of and be used to implement features of virtual reality (VR) systems. At least some of the processing circuitry 2516 can be implemented using a graphics processing unit (GPU). The functions of the processing circuitry 2516 can be executed in a distributed manner using a plurality of processing units.

The processing circuitry 2516 may include one or more circuits, processors, and/or hardware components. The processing circuitry 2516 may implement any logic, functions or instructions to perform any of the operations described herein. The processing circuitry 2516 can include any type and form of executable instructions executable by any of the circuits, processors or hardware components. The executable instructions may be of any type including applications, programs, services, tasks, scripts, libraries processes and/or firmware. Any of the object position detector 2520, calibrator 2532, eye tracker 2544, or image renderer 2560 may be any combination or arrangement of circuitry and executable instructions to perform their respective functions and operations. At least some portions of the processing circuitry 2516 can be used to implement image processing executed by the sensors 2504.

The sensors 2504a ... n can be image capture devices or cameras, including video cameras. The sensors 2504a ... n may be cameras that generate images of relatively low quality (e.g., relatively low sharpness, resolution, or dynamic range), which can help reduce the SWAP of the system 2500. For example, the sensors 2504a ... n can generate images having resolutions on the order of hundreds of pixels by hundreds of pixels. At the same time, the processes executed by the system 2500 as described herein can be used to generate display images for presentation to a user that have desired quality characteristics, including depth characteristics.

The sensors 2504a ... n (generally referred herein as sensors 2504) can include any type of one or more cameras. The cameras can be visible light cameras (e.g., color or black and white), infrared cameras, or combinations thereof. The sensors 2504a ... n can each include one or more lenses 2508a ... j generally referred herein as lens 2508). In some embodiments, the sensor 2504 can include a camera for each lens 2508. In some embodiments, the sensor 2504 include a single camera with multiple lenses 2508 a ... j. In some embodiments, the sensor 2504 can include multiple cameras, each with multiple lenses 2508. The one or more cameras of the sensor 2504 can be selected or designed to be a predetermined resolution and/or have a predetermined field of view. In some embodiments, the one or more cameras are selected and/or designed to have a resolution and field of view for detecting and tracking objects, such as in the field of view of a HMD for augmented reality. The one or more cameras may be used for multiple purposes, such as tracking objects in a scene or an environment captured by the image capture devices and performing the calibration techniques described herein.

The one or more cameras of the sensor 2504 and lens 2508 may be mounted, integrated, incorporated or arranged on an HMD to correspond to a left-eye view of a user or wearer of the HMD and a right-eye view of the user or wearer. For example, an HMD may include a first camera with a first lens mounted forward-facing on the left side of the HMD corresponding to or near the left eye of the wearer and a second camera with a second lens mounted forward-facing on the right-side of the HMD corresponding to or near the right eye of the wearer. The left camera and right camera may form a front-facing pair of cameras providing for stereographic image capturing. In some embodiments, the HMD may have one or more additional cameras, such as a third camera between the first and second cameras an offers towards the top of the HMD and forming a triangular shape between the first, second and third cameras. This third camera may be used for triangulation techniques in performing the depth buffer generations techniques of the present solution, as well as for object tracking.

The system 2500 can include a first sensor (e.g., image capture device) 2504a that includes a first lens 2508a, the first sensor 2504a arranged to capture a first image 2512a of a first view, and a second sensor 2504b that includes a second lens 2508b, the second sensor 2504b arranged to capture a second image 2512b of a second view. The first view and the second view may correspond to different perspectives, enabling depth information to be extracted from the first image 2512a and second image 2512b. For example, the first view may correspond to a left eye view, and the second view may correspond to a right eye view. The system 2500 can include a third sensor 2504c that includes a third lens 2508c, the third sensor 2504c arranged to capture a third image 2512c of a third view. As described with reference to FIG. 2, the third view may correspond to a top view that is spaced from an axis between the first lens 2508a and the second lens 2508b, which can enable the system 2500 to more effectively handle depth information that may be difficult to address with the first sensor 2504a and second sensor 2504b, such as edges (e.g., an edge of a table) that are substantially parallel to the axis between the first lens 2508a and the second lens 2508b.

Light of an image to be captured by the sensors 2504a . . . n can be received through the one or more lenses 2508 a . . . j. The sensors 2504a . . . n can include sensor circuitry, including but not limited to charge-coupled device (CCD) or complementary metal-oxide-semiconductor (CMOS) circuitry, which can detect the light received via the one or more lenses 2508a . . . j and generate images 2512a . . . k based on the received light. For example, the sensors 2504a . . . n can use the sensor circuitry to generate the first image 2512a corresponding to the first view and the second image 2512b corresponding to the second view. The one or more sensors 2504a . . . n can provide the images 2512a . . . k to the processing circuitry 2516. The one or more sensors 2504a . . . n can provide the images 2512a . . . k with a corresponding timestamp, which can facilitate synchronization of the images 2512a . . . k when image processing is executed on the images 2512a . . . k, such as to identify particular first the second images 2512a, 2512b representing first and second views and having the same timestamp that should be compared to one another to calculate gaze information.

The sensors 2504 can include eye tracking sensors 2504 or head tracking sensors 2504 that can provide information such as positions, orientations, or gaze directions of the eyes or head of the user (e.g., wearer) of an HMD. In some embodiments, the sensors 2504 are inside out tracking cameras configured to provide images for head tracking operations. The sensors 2504 can be eye tracking sensors 2504 that provide eye tracking data 2548, such as data corresponding to at least one of a position or an orientation of one or both eyes of the user. The sensors 2504 can be oriented in a direction towards the eyes of the user (e.g., as compared to sensors 2504 that capture images of an environment outside of the HMD). For example, the sensors 2504 can include at least one fourth sensor 2504d (e.g., as illustrated in FIG. 2) which can be oriented towards the eyes of the user to detect sensor data regarding the eyes of the user.

In some embodiments, the sensors 2504 output images of the eyes of the user, which can be processed to detect an eye position or gaze direction (e.g., first gaze direction) of the eyes. In some embodiments, the sensors 2504 process image data regarding the eyes of the user, and output the eye position or gaze direction based on the image data. In some embodiments, the sensors 2504 optically measure eye motion, such as by emitting light (e.g., infrared light) towards the eyes and detecting reflections of the emitted light.

As discussed further herein, an eye tracking operation can include any function, operation, routine, logic, or instructions executed by the system 2500 or components thereof to track data regarding eyes of the user, such as positions or orientations (e.g., gaze directions) of the eyes of the user as the eyes of the user move during use of the HMD. For example, the eye tracking operation can be performed using at least one of one or more sensors 2504 or eye tracker 2544.

For example, the eye tracking operation can process eye tracking data 2548 from the sensor 2504 to determine an eye position 2536 of eye(s) of the user. In some embodiments, the eye tracking operation can be performed using an eye tracker 2544 that is implemented using a portion of processing circuitry 2516 that is coupled with, mounted to, integral with, implemented using a same circuit board as, or otherwise provided with the one or sensors 2504 that detect sensor data regarding the eyes of the user (and may be implemented using different processing hardware than at least one of the object position detector 2520, calibrator 2532, or image renderer 2560). In some embodiments, the eye tracking operation can be performed using an eye tracker 2544 that receives sensor data by a wired or wireless connection from the one or more sensors 2504 that are configured to detect sensor data regarding the eyes of the user (e.g., images of the eyes of the user); for example, the eye tracker 2544 can be implemented using the same processing hardware as at least one of the object position detector 2520, calibrator 2532, or image renderer 2560. Various such combinations of sensor hardware of the sensors 2504 and/or processing hardware of the processing circuitry 2516 may be used to implement the eye tracking operation.

The eye tracker 2544 can generate the eye position 2536 in various manners. For example, the eye tracker 2544 can process the eye tracking data 2548 to identify one or more pixels representing at least one of a position or an orientation of one or more eyes of the user. The eye tracker 2544 can identify, using the eye tracking data 2548, the eye position 2536 based on pixels corresponding to light (e.g., light from sensors 2504, such as infrared or near-infrared light from sensors 2504, such as 850 nm light eye tracking) reflected by the one or more eyes of the user. The eye tracker 2544 can use light from various illumination sources or reflections in the HMD or AR system, such as from waveguides, combiners, or lens cameras. The eye tracker 2544 can determine the eye position 2536 or gaze direction by determining a vector between a pupil center of one or more eyes of the user and a corresponding reflection (e.g., corneal reflection). The eye position 2536 can include position data such as at least one of a position or an orientation of each of one or more eyes of the user. The position data can be in three-dimensional space, such as three-dimensional coordinates in a Cartesian, spherical, or other coordinate system. The eye position 2536 can include position data including a gaze direction of one or more eyes of the user.

In some embodiments, the eye tracker 2544 includes a machine learning model. The machine learning model can be used to generate the eye position 2536 based on eye tracking data 2548. For example, the eye tracking data 2548 can be applied as an input to the machine learning model, which can output the eye position 2536 (or a gaze direction of the eye position 2536). The machine learning model can be trained using training data that include historical eye tracking data 2548 and corresponding historical or labeled eye positions 2536, such as eye positions 2536 that were determined to correspond to the eye tracking data 2548. The machine learning model can be continuously updated using the eye tracking data 2548 to enable continuous calibration of the eye tracking operation. The machine learning model can be trained by monitoring a difference between candidate output generated by the machine learning model and the historical eye positions 2536, and modifying the machine learning model to reduce the difference. For example, an objective function or cost function can be evaluated using the difference, and the machine learning model can be modified using the objective function or cost function. In some embodiments, the machine learning model includes a neural network. The neural network can include a plurality of layers each including one or more nodes (e.g., neurons, perceptrons), such as a first layer (e.g., an input layer), a second layer (e.g., an output layer), and one or more hidden layers. The neural network can include characteristics such weights and biases associated with computations that can be performed between nodes of layers, which the processing circuitry 2516 can modify to train the neural network using the training data.

The sensors 2504 can capture images 2512 of an environment around the sensors 2504. For example, the sensors 2504 can capture images 2512 of an environment in or around a field of view of the user of the HMD. The images 2512 can be representations of the environment, such as color or grayscale array or matrix of pixels representing parameters of light captured from the environment (e.g., color, brightness, intensity). The environment can be an indoor or outdoor environment, including both natural and man-made structures, terrain, or other objects, including sky, clouds, roads, buildings, streets, pedestrians, or cyclists. The environment can include one or more objects (e.g., real-world objects), which can be represented by the images 2512 captured by the sensors.

The processing circuitry 2516 can include an object position detector 2520. The object position detector 2520 can receive the image 2512 from the sensors 2504. The object position detector 2520 can process the image 2512 or portions thereof to detect one or more objects represented by the image 2512. For example, the object position detector 2520 can detect or identify objects represented by the image 2512 by processing elements of the image 2512 such as pixels or groups of pixels, such as by processing pixels or groups of pixels indicating colors, shapes, edges, contrast between pixels or groups of pixels, and spatial relationships between pixels. The object position detector 2520 can detect objects by executing spatial filters, segmentation, or machine learning models trained to detect objects. The object position detector 2520 can identify candidate objects from the image 2512, such as groups of pixels representing edges, compare the candidate objects to one or more template objects (e.g., template objects or features thereof in an object database), and identify the objects of the image 2512 based on candidate objects that match template objects. The object position detector 2520 can apply various objection recognition algorithms or models to identify the objects. The objects can be real-world or simulated objects.

In some embodiments, the object position detector 2520 does not specifically identify a type, class, or other identifier of the object in the image 2512. The object position detector 2520 can receive an indication from the sensors 2504 that the object has been detected by the sensors 2504. For example, the object position detector 2520 can receive an indication that a particular image 2512 represents an object (in which case the object position detector 2520 can process the image 2512 to identify one or more pixels corresponding to the object). In some embodiments, the indication can include one or more pixels corresponding to the object.

In some embodiments, the object position detector 2520 detects the object using an object database that can include location data of various objects, buildings, structures, roads, or other indoor and outdoor features. For example, the object position detector 2520 can communicate with an object database mapping objects or features of objects to position data. The object database may also maintain semantic or textual information regarding objects, such as information regarding type, class, shape, color, size, or other features regarding the objects. The object database can be based on reconstruction of environments using image data (which can be updated using images 2512 detected by the sensors 2504). The object database can be maintained, processed (e.g., to generate semantic or textual information or descriptors), and updated by a server remote from the system 2500, which the system 2500 can communicate with to access the object database. The object position detector 2520 can receive data regarding the position of the HMD or AR system (e.g., from position sensor 2620 described with reference to FIG. 26), and use the data to retrieve one or more candidate objects from the object database. The object position detector 2520 can compare the sensor data to the one or more candidate objects and information maintained by the object database regarding the one or more candidate objects to identify the object (e.g., by matching the sensor data to the information received from the object database).

The object position detector 2520 can determine a position of the object using information received from the sensors 2504, such as the image 2512 or the indication that the image 2512 represents an object. For example, the object position detector 2520 can identify one or more pixels corresponding to the object. In some embodiments, the object position detector 2520 determines the position of the object as a position in an image space of the image 2512, such as by assigning one or more pixels corresponding to the object as the position of the object. In some embodiments, the object position detector 2520 determines the position of the object as a position in three-dimensional space (e.g., real world space, AR or VR space, space in the environment around the HMD or AR system), such as by using depth information to determine the position of the object.

The object position detector 2520 can determine a gaze direction using the position of the object, such as a gaze direction towards the position of the object. For example, the object position detector 2520 can identify an expected position of the eyes of the user, and determine a vector from the eyes of the user to the position of the object (or vice versa). In some embodiments, the expected position includes a left eye position and a right eye position, and the object position detector 2520 can determine the gaze direction using the left eye position and the right eye position, such as by averaging the left eye position and the right eye position, or averaging respective vectors from the left eye position to the position of the object and from the right eye position to the position of the object.

The processing circuitry 2516 can detect that the user is gazing at the object. For example, the processing circuitry 2516 can use sensor data regarding the eyes of the user or scene understanding, such as contextual information, to detect that the user is gazing at the object (e.g., as compared to other objects that the object position detector 2520 has not determined the position of). The processing circuitry 2516 can use any combination of sensor data to detect that the user is gazing at the object, such as by assigning a confidence score to each object regarding whether the user is gazing at the object, and determine the confidence score as a weighted average from contributions of the sensor data. The processing circuitry 2516 can compare the confidence score to a threshold confidence, and detect that the user is gazing at the object responsive to the confidence score meeting or exceeding the threshold confidence. In some embodiments, the processing circuitry 2516 assigns a relatively higher confidence score to the object based on the object being one of at most a threshold number of objects in the scene (e.g., in a field of view of the HMD). For example, if the object is the only object in the scene, then there may be a greater likelihood that the user is gazing at the object. If the object is detected to be or include a face, such as another person speaking, there may be a greater likelihood that the user is gazing at the object.

The processing circuitry 2516 can monitor positions of a plurality of objects, and detect whether the user is gazing at one or more of the plurality of objects, which can be used by the calibrator 2532 as described below to determine differences between gaze directions corresponding to the plurality of objects and gaze directions or eye positions 2536 from the eye tracker 2544 to calibrate the eye tracker 2544.

In some embodiments, the processing circuitry 2516 can detect that the user is gazing at the object by identifying features of interest corresponding to the object, such as text data. The processing circuitry 2516 can process the image 2512 representing the object to determine whether there is text data corresponding to the object. The processing circuitry 2516 can detect that the user is gazing at the object responsive to identifying text data of the object. The processing circuitry 2516 can detect that the user is gazing at the object based on the user providing the text data, such as if the user is writing. Similarly, the processing circuitry 2516 can detect that the user is gazing at the object based on detecting movement of one or more hands of the user in a particular manner, such as by detecting that the user is writing or drawing based on the movement of the hands and resulting changes in the scene (e.g., the movement of the hands corresponding to drawn or written objects in a vicinity of the hands).

The processing circuitry 2516 can detect that the user is gazing at the object based on an interaction of the user with the object. For example, the processing circuitry 2516 can identify one or more hands of the user in the images 2512, monitor the one or more hands, and determine that the user is interacting with the object based on the one or more hands contacting or intersecting the object (e.g., at least one pixel corresponding to the one or more hands is within a threshold distance of the object, such as a threshold distance less than or equal to 10 pixels, less than or equal to 5 pixels, less than or equal to 2 pixels, or less than or equal to 1 pixel). For example, the processing circuitry 2516 can detect that the user is gazing at the object based on the user picking up a glass of water using image data of the sensor data indicating that hands of the user are interacting with the glass of water. The processing circuitry 2516 can detect that the user is gazing at the object based on determining that the one or more hands of the user are moving the object, such as if the object is a controller, racket, or ball.

The processing circuitry 2516 can detect that the user is gazing at the object based on the object being a moving object, such as by determining that the object has come into view of the sensors 2504. For example, the processing circuitry 2516 can determine that the object is present in an image received from the sensors 2504 and was not present in a previous image received from the sensors 2504. The processing circuitry 2516 can determine whether the object is present by tracking one or more pixels corresponding to the object across images. The processing circuitry 2516 can determine that the object is a moving object by detecting motion of the object, such as by determining that the one or more pixels corresponding to the object have different positions between images.

In some embodiments, the processing circuitry 2516 prompts the user to gaze at the detected object. For example, the processing circuitry 2516 can generate a prompt that includes at least one of a visual cue, an audio cue, or a text cue regarding the detected object. The prompt can indicate the position of the detected object. For example, the visual cue can be presented in a manner overlaying the detected object, which can guide the user to gaze at the detected object. The visual cue can include a color, change in brightness, outline, or other cue that can be used to direct attention to the object. The processing circuitry 2516 can generate the prompt to include a plurality of visual cues, such as an animation.

The processing circuitry 2516 can include a calibrator 2532. The calibrator 2532 can calibrate the eye tracking operation, such as by providing calibration instructions to at least one of the eye tracker 2544 or the sensors 2504 that are used for the eye tracking operation. The calibrator 2532 can generate calibration instructions that can indicate a change in angle, orientation, position, or other parameters associated with eye tracking.

In some embodiments, the calibrator 2532 determines a gaze direction (e.g., second gaze direction) of the user based on information received from the eye tracking operation, such as an eye position 2536 received from the eye tracker 2544. The eye position 2536 can include at least one of a position or an orientation of one or more eyes of the user. The calibrator 2532 can determine the gaze direction using the eye position 2536 by identifying one or more directions corresponding to a line of sight of the eye(s) of the user, such as directions that are perpendicular to a target point on one or both eyes of the user. The eye position 2536 can include or indicate the gaze direction, in some embodiments.

The calibrator 2532 can calibrate the eye tracking operation using the gaze direction 2524 and the gaze direction determined based on at least the eye position 2536. For example, the calibrator 2532 can compare the gaze directions to determine a difference between the gaze directions. The difference can be a difference in angles, such as a difference in one or more angles of a coordinate system used to represent the gaze directions. The difference can be a vector, such as a vector resulting from comparing (e.g., subtracting) the gaze directions.

The calibrator 2532 can calibrate the eye tracking operation by generating the calibration 2540 based on the difference and providing the calibration 2540 to the eye tracker 2544. For example, the calibrator 2532 can generate the calibration 2540 to cause the eye tracker 2544 to adjust one or more parameters that the eye tracker 2544 uses to generate the eye position 2536, such as parameters that the eye tracker 2544 applies to the eye tracking data 2548 to determine the eye position 2536.

In some embodiments, the calibrator 2532 monitors a confidence score of at least one of scene understanding regarding the object or detecting that the user is gazing at the object. For example, the confidence score regarding the object can correspond to a confidence that the object is identified correctly (e.g., based on a match score of image data regarding the object to template image data). The confidence score of detecting that the user is gazing at the object can correspond to a confidence that the user is gazing at the object (e.g., based on the sensor data used to determine that the user is gazing at the object). The calibrator 2532 can provide the calibration 2540 to the eye tracker 2544 responsive to the confidence score meeting or exceeding a respective threshold, which can enable the calibrator 2532 to selectively re-calibrate the eye tracker 2544 when there is a relatively high certainty that the object has been properly identified and that the user is gazing at the object.

In some embodiments, the calibrator 2532 uses vergence cues to determine how to calibrate the eye tracker 2544 or a varifocal system (e.g., varifocal system 2624 described with reference to FIG. 26). For example, the calibrator 2532 can determine a vergence plane (e.g., first vergence plane) based on the gaze direction 2524, determine a vergence plane (e.g., second vergence plane) based on the gaze direction corresponding to the eye position 2536, and calibrate the eye tracker 2544 based on a difference between the vergence planes. The vergence planes can correspond to planes perpendicular to the respective gaze directions (e.g., planes where lines of sight from the eyes would meet). The calibrator 2532 can provide the vergence plane or instructions to adjust the vergence plane to the varifocal system 2624, enabling the varifocal system 2624 to modify a focus using the information received from the calibrator 2532.

The calibrator 2532 can calibrate the eye tracking operation in a continuous or semi-continuous manner, such as by recalibrating the eye tracking operation periodically or responsive to changes in use of the HMD or AR system or the environment around the HMD or AR system. In some embodiments, the calibrator 2532 periodically calibrates the eye tracking operation. For example, the calibrator 2532 can initiate a timer responsive to providing calibration instructions to the eye tracker 2544, and re-calibrate or update the eye tracking operation, responsive to the timer exceeding a predetermined threshold time, using updated values of the gaze direction 2524 and eye position 2536.

In some embodiments, the calibrator 2532 monitors at least one of motion data of the HMD or AR system (e.g., using position sensor 2620 described with reference to FIG. 26) or motion data of objects in view of the HMD or AR system. The calibrator 2532 can compare the motion data (e.g., position, orientation, velocity, acceleration data) to one or more respective thresholds, and re-calibrate or update the eye tracking operation using updated values of the gaze direction 2524 and eye position 2536 responsive to the motion data exceeding the one or more respective thresholds. The calibrator 2532 can prompt the user to gaze at an object responsive to the motion data exceeding the one or more respective thresholds.

In some embodiments, the calibrator 2532 maintains a slip compensation model. The slip compensation model can monitor the difference between the gaze direction of the eye position 2536 and the gaze direction 2524, and cause the calibrator 2532 to calibrate the eye tracker 2544 responsive to the difference exceeding a threshold. In some embodiments, the slip compensation model includes a machine learning model, such as a neural network. The slip compensation model can be trained to determine when to cause the calibrator 2532 to calibrate the eye tracker 2544, such as by training the slip compensation to determine the threshold. For example, training data can be provided to the slip compensation model that includes differences between gaze directions 124 and eye positions 2536 (or gaze directions of eye positions 2536) along with labeled indications of when the differences are too large, such as labeled indications corresponding to user feedback.

The processing circuitry 2516 can include an image renderer 2560. The image renderer 2560 can be a 3D image renderer. The image renderer 2560 may use image related input data to process, generate and render display or presentation images to display or present on one or more display devices, such as via an HMD. The image renderer 2560 can generate or create 2D images of a scene or view for display on display 164 and representing the scene or view in a 3D manner. The display or presentation data to be rendered can include geometric models of 3D objects in the scene or view. The image renderer 2560 may determine, compute or calculate the pixel values of the display or image data to be rendered to provide the desired or predetermined 3D image(s), such as 3D display data for the images 2512 captured by the sensor 2504. The image renderer 2560 can receive the images 2512 and receive the eye position 2536, and generate display images using the images 2512 and the eye position 2536, such as to determine where to locate augmented reality information for presentation by displays 164 based on the eye position 2536 (or gaze direction corresponding to the eye position 2536).

The image renderer 2560 can render frames of display data to one or more displays 164 based on temporal and/or spatial parameters. The image renderer 2560 can render frames of image data sequentially in time, such as corresponding to times at which images are captured by the sensors 2504. The image renderer 2560 can render frames of display data based on changes in position and/or orientation to the sensors 2504, such as the position and orientation of the HMD. The image renderer 2560 can render frames of display data based on left-eye view(s) and right-eye view(s) such as displaying a left-eye view followed by a right-eye view or vice-versa.

The image renderer 2560 can generate the display images using motion data regarding movement of the sensors 2504a . . . n that captured the images 2512a . . . k. For example, the sensors 2504a . . . n may change in at least one of position or orientation due to movement of a head of the user wearing an HMD that includes the sensors 2504a . . . n (e.g., as described with reference to HMD system 2600 of FIG. 26). The processing circuitry 2516 can receive the motion data from a position sensor (e.g., position sensor 2620 described with reference to FIG. 26). The image renderer 2560 can use the motion data to calculate a change in at least one of position or orientation between a first point in time at which the images 2512a . . . k were captured and a second point in time at which the display images will be displayed, and generate the display images using the calculated change. The image renderer 2560 can use the motion data to interpolate and/or extrapolate the display images relative to the images 2512a . . . k.

Although the image renderer 2560 is shown as part of the processing circuitry 2516, the image renderer may be formed as part of other processing circuitry of a separate device or component, such as the display device, for example within the HMD.

The system 2500 can include one or more displays 164. The one or more displays 164 can be any type and form of electronic visual display. The displays may have or be selected with a predetermined resolution and refresh rate and size. The one or more displays can be of any type of technology such as LCD, LED, ELED or OLED based displays. The form factor of the one or more displays may be such to fit within the HMD as glasses or goggles in which the display(s) are the leans within the frame of the glasses or goggles. The displays 164 may have a refresh rate the same or different than a rate of refresh or frame rate of the processing circuitry 2516 or the image renderer 2560 or the sensors 2504. The displays 164 can include one or more waveguides (e.g., waveguides 228 described with reference to FIG. 26), such that calibration of the eye tracking operation can be used to more accurately control operation of the waveguides using pupil locations indicated by the eye tracking.

Referring now to FIG. 26, in some implementations, an HMD system 2600 can be used to implement the system 2500. The HMD system 2600 can include an HMD body 2602, a left sensor 2504a (e.g., left image capture device), a right sensor 2504b (e.g., right image capture device), and the display 164. The HMD body 2602 can have various form factors, such as glasses or a headset. The sensors 2504a, 2504b can be mounted to or integrated in the HMD body 2602. The left sensor 2504a can capture first images corresponding to a first view (e.g., left eye view), and the right sensor 2504b can capture images corresponding to a second view (e.g., right eye view).

The HMD system 2600 can include a top sensor 2504c (e.g., top image capture device). The top sensor 2504c can capture images corresponding to a third view different than the first view or the second view. For example, the top sensor 2504c can be positioned between the left sensor 2504a and right sensor 2504b and above a baseline between the left sensor 2504a and right sensor 2504b. This can enable the top sensor 2504c to capture images with depth information that may not be readily available to be extracted from the images captured by the left and right sensors 2504a, 2504b. For example, it may be difficult for depth information to be effectively extracted from images captured by the left and right sensors 2504a, 2504b in which edges (e.g., an edge of a table) are parallel to a baseline between the left and right sensors 2504a, 2504b. The top sensor 2504c, being spaced from the baseline, can capture the third image to have a different perspective, and thus enable different depth information to be extracted from the third image, than the left and right sensors 2504a, 2504b.

The HMD system 2600 can include processing circuitry 2516, which can perform at least some of the functions described with reference to FIG. 25, including receiving sensor data from the sensors 2504a, 2504b, and 2504c as well as eye tracking sensors 2504, and processing the received images to calibrate an eye tracking operation.

The HMD system 2600 can include communications circuitry 2604. The communications circuitry 2604 can be used to transmit electronic communication signals to and receive electronic communication signals from at least one of a client device 2608 or a server 2612. The communications circuitry 2604 can include wired or wireless interfaces (e.g., jacks, antennas, transmitters, receivers, transceivers, wire terminals) for conducting data communications with various systems, devices, or networks. For example, the communications circuitry 2604 can include an Ethernet card and port for sending and receiving data via an Ethernet-based communications network. The communications circuitry 2604 can communicate via local area networks (e.g., a building LAN), wide area networks (e.g., the Internet, a cellular network), and/or conduct direct communications (e.g., NFC, Bluetooth). The communications circuitry 2604 can conduct wired and/or wireless communications. For example, the communications circuitry 2604 can include one or more wireless transceivers (e.g., a Wi-Fi transceiver, a Bluetooth transceiver, a NFC transceiver, a cellular transceiver). For example, the communications circuitry 2604 can establish wired or wireless connections with the at least one of the client device 2608 or the server 2612. The communications circuitry 2604 can establish a USB connection with the client device 2608.

The HMD system 2600 can be deployed using different architectures. In some embodiments, the HMD (e.g., HMD body 2602 and components attached to the HMD body 2602) comprises the processing circuitry 2516 and is self-contained portable unit. In some embodiments, the HMD has portions of the processing circuitry 2516 that work in cooperation with or in conjunction with any type of portable or mobile computing device or companion device that has the processing circuitry or portions thereof, such as in the form of a staging device, a mobile phone or wearable computing device. In some embodiments, the HMD has portions of the processing circuitry 2516 that work in cooperation with or in conjunction with processing circuitry, or portions thereof, of a desktop computing device. In some embodiments, the HMD has portions of the processing circuitry 2516 that works in cooperation with or in conjunction with processing circuitry, or portions thereof, of a server computing device, which may be deployed remotely in a data center or cloud computing environment. In any of the above embodiments, the HMD or any computing device working in conjunction with the HMD may communicate with one or more servers in performing any of the functionality and operations described herein.

The client device 2608 can be any type and form of general purpose or special purpose computing device in any form factor, such as a mobile or portable device (phone, tablet, laptop, etc.), or a desktop or personal computing (PC) device. In some embodiments, the client device can be a special purpose device, such as in the form of a staging device, which may have the processing circuitry or portions thereof. The special purpose device may be designed to be carried by the user while wearing the HMD, such as by attaching the client device 2608 to clothing or the body via any type and form of accessory attachment. The client device 2608 may be used to perform any portion of the image and rendering processing pipeline described in connection with FIGS. 1 and 3. The HMD may perform some or other portions of the image and rendering processing pipeline such as image capture and rendering to the display 164. The HMD can transmit and receive data with the client device 2608 to leverage the client device 2608's computing power and resources which may have higher specifications than those of the HMD.

The server 2612 can be any type of form of computing device that provides applications, functionality or services to one or more client devices 2608 or other devices acting as clients. In some embodiments, the server 2612 can be a client device 2608. The server 2612 can be deployed in a data center or cloud computing environment accessible via one or more networks. The HMD and/or client device 2608 can use and leverage the computing power and resources of the server 2612. The HMD and/or client device 2608 can implement any portion of the image and rendering processing pipeline described in connection with FIGS. 1 and 3. The server 2612 can implement any portion of the image and rendering processing pipeline described in connection with FIGS. 1 and 3, and in some cases, any portions of the image and rendering processing pipeline not performed by client device 2608 or HMD. The server 2612 may be used to update the HMD and/or client device 2608 with any updated to the applications, software, executable instructions and/or data on the HMD and/or client device 2608.

The system 2600 can include a position sensor 2620. The position sensor 2620 can output at least one of a position or an orientation of the body 2602. As the image capture devices 2504a, 2504b, 2504c can be fixed to the body 2602 (e.g., at predetermined locations relative to the position sensor 2620), the position sensor 2620 can output at least one of a position or an orientation of each sensor 2504a, 2504b, 2504c. The position sensor 2620 can include at least one of an inertial measurement unit (IMU), an accelerometer, a gyroscope, or a magnetometer (e.g., magnetic compass).

The system 2600 can include a varifocal system 2624. The varifocal system 2624 can have a variable focal length, such that the varifocal system 2624 can change a focus (e.g., a point or plane of focus) as focal length or magnification changes. The varifocal system 2624 can include at least one of a mechanical lens, liquid lens, or polarization beam plate. As discussed above, the varifocal system 2624 can be calibrated by the processing circuitry 2516 (e.g., by calibrator 2532), such as by receiving an indication of a vergence plane from the calibrator 2532 which can be used to change the focus of the varifocal system 2624. In some embodiments, the varifocal system 2624 can enable a depth blur of one or more objects in the scene by adjusting the focus based on information received from the calibrator 2532 so that the focus is at a different depth than the one or more objects.

In some embodiments, the display 164 includes one or more waveguides 228. The waveguides 228 can receive (e.g., in-couple) light corresponding to display images to be displayed by the display 164 from one or more projectors 232, and output (e.g., out-couple) the display images, such as for viewing by a user of the HMD. The waveguides 228 can perform horizontal or vertical expansion of the received light to output the display images at an appropriate scale. The waveguides 228 can include one or more lenses, diffraction gratings, polarized surfaces, reflective surfaces, or combinations thereof to provide the display images based on the received light. The projectors 232 can include any of a variety of projection devices, such as LCD, LED, OLED, DMD, or LCOS devices, among others, to generate the light to be provided to the one or more waveguides 228. The projectors 232 can receive the display images from the processing circuitry 2516 (e.g., from image renderer 2560). The one or more waveguides 228 can be provided through a display surface (e.g., glass), which can be at least partially transparent to operate as a combiner (e.g., combining light from a real world environment around the HMD with the light of the outputted display images).

Operation of the display 164 and components thereof, such as the one or more waveguides 228 or the one or more projectors 232, can be modified or controlled responsive to the calibration of the eye tracking operation. For example, the processing circuitry 2516 an cause the one or more projectors 232 to provide the display images using the one or more waveguides 228 based on a pupil location corresponding to each eye of the user based on the calibrated eye tracking operation. The processing circuitry 2516 can use the calibrated eye tracking operation to correct uniformity of the one or more waveguides 228 so that the display images provided via the one or more waveguides 228 are aligned with the gaze directions of the eyes of the user.

The display 164 can perform foveated rendering based on the calibrated eye tracking operation, which can indicate a gaze point corresponding to the gaze direction generated by the eye tracking operation. For example, the processing circuitry 2516 can identify at least one of a central region of the FOV of the display 164 (e.g., a plurality of pixels within a threshold distance from the gaze point) peripheral region of the FOV of the display 164 based on the gaze point (e.g., a peripheral region represented by a plurality of pixels of the display images that are within a threshold distance of an edge of the display images or more than a threshold distance from the gaze point). The processing circuitry 2516 can generate the display images to have a less quality (e.g., resolution, pixel density, frame rate) in the peripheral region than in the central region, which can reduce processing demand associated with operation of the HMD system 2600.

Various operations described herein can be implemented on computer systems. FIG. 27 shows a block diagram of a representative server system 2700 and client computer system 2714 usable to implement the present disclosure. Server system 2700 or similar systems can implement services or servers described herein or portions thereof. Client computer system 2714 or similar systems can implement clients described herein. Each of the systems 2500, 2600 and others described herein can incorporate features of the systems 2700, 2714.

Server system 2700 can have a modular design that incorporates a number of modules 2702 (e.g., blades in a blade server); while two modules 2702 are shown, any number can be provided. Each module 2702 can include processing unit(s) 2704 and local storage 2706.

Processing unit(s) 2704 can include a single processor, which can have one or more cores, or multiple processors. Processing unit(s) 2704 can include a general-purpose primary processor as well as one or more special-purpose co-processors such as graphics processors, digital signal processors, or the like. Some or all processing units 2704 can be implemented using customized circuits, such as application specific integrated circuits (ASICs) or field programmable gate arrays (FPGAs). Such integrated circuits execute instructions that are stored on the circuit itself. Processing unit(s) 2704 can execute instructions stored in local storage 2706. Any type of processors in any combination can be included in processing unit(s) 2704.

Local storage 2706 can include volatile storage media (e.g., conventional DRAM, SRAM, SDRAM, or the like) and/or non-volatile storage media (e.g., magnetic or optical disk, flash memory, or the like). Storage media incorporated in local storage 2706 can be fixed, removable or upgradeable as desired. Local storage 2706 can be physically or logically divided into various subunits such as a system memory, a read-only memory (ROM), and a permanent storage device. The system memory can be a read-and-write memory device or a volatile read-and-write memory, such as dynamic random-access memory. The system memory can store some or all of the instructions and data that processing unit(s) 2704 need at runtime. The ROM can store static data and instructions that are needed by processing unit(s) 2704. The permanent storage device can be a non-volatile read-and-write memory device that can store instructions and data even when module 2702 is powered down. The term "storage medium" as used herein includes any medium in which data can be stored indefinitely (subject to overwriting, electrical disturbance, power loss, or the like) and does not include carrier waves and transitory electronic signals propagating wirelessly or over wired connections.

Local storage 2706 can store one or more software programs to be executed by processing unit(s) 2704, such as an operating system and/or programs implementing various server functions such as functions of the system 2500, or any other system described herein, or any other server(s) associated with the system 2500 or any other system described herein.

"Software" refers generally to sequences of instructions that, when executed by processing unit(s) 2704 cause server system 2700 (or portions thereof) to perform various operations, thus defining one or more specific machine implementations that execute and perform the operations of the software programs. The instructions can be stored as firmware residing in read-only memory and/or program code stored in non-volatile storage media that can be read into volatile working memory for execution by processing unit(s) 2704. Software can be implemented as a single program or a collection of separate programs or program modules that interact as desired. From local storage 2706 (or non-local storage described below), processing unit(s) 2704 can retrieve program instructions to execute and data to process in order to execute various operations described above.

In some server systems 2700, multiple modules 2702 can be interconnected via a bus or other interconnect 2708, forming a local area network that supports communication between modules 2702 and other components of server system 2700. Interconnect 2708 can be implemented using various technologies including server racks, hubs, routers, etc.

A wide area network (WAN) interface 2710 can provide data communication capability between the local area network (interconnect 2708) and a larger network, such as the Internet. Conventional or other activities technologies can be used, including wired (e.g., Ethernet, IEEE 802.3 standards) and/or wireless technologies (e.g., Wi-Fi, IEEE 802.11 standards).

Local storage 2706 can provide working memory for processing unit(s) 2704, providing fast access to programs and/or data to be processed while reducing traffic on interconnect 2708. Storage for larger quantities of data can be provided on the local area network by one or more mass storage subsystems 412 that can be connected to interconnect 2708. Mass storage subsystem 2712 can be based on magnetic, optical, semiconductor, or other data storage media. Direct attached storage, storage area networks, network-attached storage, and the like can be used. Any data stores or other collections of data described herein as being produced, consumed, or maintained by a service or server can be stored in mass storage subsystem 2712. Additional data storage resources may be accessible via WAN interface 2710 (potentially with increased latency).

Server system 2700 can operate in response to requests received via WAN interface 2710. For example, one of modules 2702 can implement a supervisory function and assign discrete tasks to other modules 2702 in response to received requests. Conventional work allocation techniques can be used. As requests are processed, results can be returned to the requester via WAN interface 2710. Such operation can generally be automated. WAN interface 2710 can connect multiple server systems 2700 to each other, providing scalable systems capable of managing high volumes of activity. Conventional or other techniques for managing server systems and server farms (collections of server systems that cooperate) can be used, including dynamic resource allocation and reallocation.

Server system 2700 can interact with various user-owned or user-operated devices via a wide-area network such as the Internet. An example of a user-operated device is shown in FIG. 27 as client computing system 2714. Client computing system 2714 can be implemented, for example, as a consumer device such as a smartphone, other mobile phone, tablet computer, wearable computing device (e.g., smart watch, eyeglasses), desktop computer, laptop computer, and so on.

For example, client computing system 2714 can communicate via WAN interface 2710. Client computing system 2714 can include conventional computer components such as processing unit(s) 2716, storage device 2718, network interface 2720, user input device 2722, and user output device 2724. Client computing system 2714 can be a computing device implemented in a variety of form factors, such as a desktop computer, laptop computer, tablet computer, smartphone, other mobile computing device, wearable computing device, or the like.

Processor 2716 and storage device 2718 can be similar to processing unit(s) 2704 and local storage 2706 described above. Suitable devices can be selected based on the demands to be placed on client computing system 2714; for example, client computing system 2714 can be implemented as a "thin" client with limited processing capability or as a high-powered computing device. Client computing system 2714 can be provisioned with program code executable by processing unit(s) 2716 to enable various interactions with server system 2700 of a message management service such as accessing messages, performing actions on messages, and other interactions described above. Some client computing systems 414 can also interact with a messaging service independently of the message management service.

Network interface 2720 can provide a connection to a wide area network (e.g., the Internet) to which WAN interface 2710 of server system 2700 is also connected. Network interface 2720 can include a wired interface (e.g., Ethernet) and/or a wireless interface implementing various RF data communication standards such as Wi-Fi, Bluetooth, or cellular data network standards (e.g., 3G, 4G, LTE, etc.).

User input device 2722 can include any device (or devices) via which a user can provide signals to client computing system 2714; client computing system 2714 can interpret the signals as indicative of particular user requests or information. User input device 2722 can include any or all of a keyboard, touch pad, touch screen, mouse or other pointing device, scroll wheel, click wheel, dial, button, switch, keypad, microphone, and so on.

User output device 2724 can include any device via which client computing system 2714 can provide information to a user. For example, user output device 2724 can include a display to display images generated by or delivered to client computing system 2714. The display can incorporate various image generation technologies, e.g., a liquid crystal display (LCD), light-emitting diode (LED) including organic light-emitting diodes (OLED), projection system, cathode ray tube (CRT), or the like, together with supporting electronics (e.g., digital-to-analog or analog-to-digital converters, signal processors, or the like). A device such as a touchscreen that function as both input and output device can be used. Output devices 2724 can be provided in addition to or instead of a display. Examples include indicator lights, speakers, tactile "display" devices, printers, and so on.

Some implementations include electronic components, such as microprocessors, storage and memory that store computer program instructions in a computer readable storage medium. Many of the features described in this specification can be implemented as processes that are specified as a set of program instructions encoded on a computer readable storage medium. When these program instructions are executed by one or more processing units, they cause the processing unit(s) to perform various operation indicated in the program instructions. Examples of program instructions or computer code include machine code, such as is produced by a compiler, and files including higher-level code that are executed by a computer, an electronic component, or a microprocessor using an interpreter. Through suitable programming, processing unit(s) 2704 and 2716 can provide various functionality for server system 2700 and client computing system 2714, including any of the functionality described herein as being performed by a server or client, or other functionality associated with message management services.

It will be appreciated that server system 2700 and client computing system 2714 are illustrative and that variations and modifications are possible. Computer systems used in connection with the present disclosure can have other capabilities not specifically described here. Further, while server system 2700 and client computing system 2714 are described with reference to particular blocks, it is to be understood that these blocks are defined for convenience of description and are not intended to imply a particular physical arrangement of component parts. For instance, different blocks can be but need not be located in the same facility, in the same server rack, or on the same motherboard. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Implementations of the present disclosure can be realized in a variety of apparatus including electronic devices implemented using any combination of circuitry and software.

Configuration of Illustrative Embodiments

Having now described some illustrative implementations, it is apparent that the foregoing is illustrative and not limiting, having been presented by way of example. In particular, although many of the examples presented herein involve specific combinations of method acts or system elements, those acts and those elements can be combined in other ways to accomplish the same objectives. Acts, elements and features discussed in connection with one implementation are not intended to be excluded from a similar role in other implementations or implementations.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device, etc.) may include one or more devices (e.g., RAM, ROM, Flash memory, hard disk storage, etc.) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit and/or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular can also embrace implementations including a plurality of these elements, and any references in plural to any implementation or element or act herein can also embrace implementations including only a single element. References in the singular or plural form are not intended to limit the presently disclosed systems or methods, their components, acts, or elements to single or plural configurations. References to any act or element being based on any information, act or element can include implementations where the act or element is based at least in part on any information, act, or element.

Any implementation disclosed herein can be combined with any other implementation or embodiment, and references to "an implementation," "some implementations," "one implementation" or the like are not necessarily mutually exclusive and are intended to indicate that a particular feature, structure, or characteristic described in connection with the implementation can be included in at least one implementation or embodiment. Such terms as used herein are not necessarily all referring to the same implementation. Any implementation can be combined with any other implementation, inclusively or exclusively, in any manner consistent with the aspects and implementations disclosed herein.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Systems and methods described herein may be embodied in other specific forms without departing from the characteristics thereof. References to "approximately," "about" "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

The term "coupled" and variations thereof includes the joining of two members directly or indirectly to one another. Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

References to "or" can be construed as inclusive so that any terms described using "or" can indicate any of a single, more than one, and all of the described terms. A reference to "at least one of 'A' and 'B'" can include only 'A', only 'B', as well as both 'A' and 'B'. Such references used in conjunction with "comprising" or other open terminology can include additional items.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

References herein to the positions of elements (e.g., "top," "bottom," "above," "below") are merely used to describe the orientation of various elements in the FIGURES. The orientation of various elements may differ according to other exemplary embodiments, and that such variations are intended to be encompassed by the present disclosure.

What is claimed is:

1. A method for adjusting sound output of a worn audio device, the method comprising:
obtaining orientation or position data that indicates an orientation or a position of the worn audio device;
determining at least one change in the orientation or position data indicating a change in orientation or position of the worn audio device relative to a user's ear;
in response to the at least one change in the orientation or position data:
adjusting or selecting values of parameters for a filter, the values of the parameters adjusted or selected based on an amount of the change in orientation or position of the worn audio device relative to the user's ear, the filter configured to adjust sound output produced by the worn audio device, wherein adjusting or selecting the parameters configures the filter to perform an equalization to output a target sound frequency response that accounts for the change in orientation or position of the worn audio device relative to the user's ear; and
operating the worn audio device to provide the sound output according to the target sound frequency response using the filter.

2. The method of claim 1, wherein the position or orientation of the worn audio device are defined in a Cartesian coordinate system, a spherical coordinate system, or a cylindrical coordinate system.

3. The method of claim 1, wherein the orientation or position data comprises values of any one or more of an azimuth, an elevation, a distance, a pitch, a yaw, or a roll of the worn audio device relative to the user's ear.

4. The method of claim 3, wherein adjusting the parameters of the filter comprises using the orientation or position data in a model of the filter, wherein the model of the filter defines an adjusted equalization variable as a function of at least one of the orientation or position data, or changes in the orientation or position data, and the parameters.

5. The method of claim 4, wherein each of the parameters correspond to the value of the azimuth, the elevation, the distance, the pitch, the yaw, or the roll of the orientation or position data.

6. The method of claim 5, wherein each of the corresponding parameters are determined based on empirical data and one of a linear model, or a machine learning algorithm.

7. The method of claim 4, wherein selecting the parameters for the filter comprises selecting a set of values of the corresponding parameters of the model, wherein each set corresponds to a different head size or head shape of the user.

8. The method of claim 1, wherein adjusting the parameters of the filter comprises:
adjusting parameters of a first filter associated with a first worn audio device for use with a user's first ear using orientation and position of the first worn audio device; and
adjusting parameters of a second filter associated with a second worn audio device for use with a user's second ear using orientation and position of the second worn audio device.

9. The method of claim 1, wherein the parameters of the filter are adjusted or selected using the position or orientation data at one of a scheduled time interval or in response to the orientation or position data changing.

10. A head wearable audio device comprising:
a speaker configured to provide sound to a user's ear;
at least one sensor configured to measure orientation or position associated with the head wearable audio device; and
a controller configured to:
track changes in the orientation or position indicating changes in the orientation or position of the head wearable audio device relative to the user's ear; and
adjust values of parameters of a filter based on an amount of the change in orientation of position of the head wearable audio device relative to the user's ear, the filter configured to adjust the sound provided to the user's ear by the speaker using the orientation or position of the head wearable audio device wherein adjusting parameters of the filter configures to the filter to perform a compensation to output a target sound frequency response that accounts for the changes in the orientation or position of the head wearable audio device relative to a user's ear.

11. The head wearable audio device of claim 10, wherein the changes in the orientation or position indicate an adjustment of position and orientation of the head wearable audio device relative to the user's ear when the user removes and returns the head wearable audio device to a user's head.

12. The head wearable audio device of claim 10, wherein the orientation or position comprises values of any of an azimuth, an elevation, a distance, a pitch, a yaw, or a roll of the head wearable audio device with respect to the user's ear.

13. The head wearable audio device of claim 12, wherein adjusting the parameters of the filter comprises determining a value of an adjusted equalization variable and adjusting the sound provided to the user's ear using the value of the adjusted equalization variable.

14. The head wearable audio device of claim 13, wherein determining the value of the adjusted equalization variable comprises using the values of one or more of the azimuth, the elevation, the distance, the pitch, the yaw, or the roll, and the parameters.

15. The head wearable audio device of claim 14, wherein each of the corresponding parameters are determined based on experimental data and one of a linear model, or a machine learning algorithm, and the controller is configured to select a set of values of the corresponding parameters, wherein each set corresponds to a different head size or head shape of the user.

16. The head wearable audio device of claim 10, wherein the controller is configured to adjust the filter by:
adjusting parameters of a first filter associated with a first sound producing device for use with a user's first ear using orientation and position of the first sound producing device; and
adjusting parameters of a second filter associated with a second sound producing device for use with a user's second ear using orientation and position of the second sound producing device.

17. The head wearable audio device of claim 16, wherein the first sound producing device and the second sound producing device are pre-calibrated based on free field responses.

18. The head wearable audio device of claim 10, wherein the parameters of the filter is adjusted using the position or orientation at one of a scheduled time interval or in response to the data changing.

19. A controller for a head wearable audio device comprising circuitry configured to:
receive orientation and position data from an orientation sensor or a position sensor;
determine at least one change in the orientation and position data, indicating a change in orientation or position of the head wearable audio device relative to a user's ear; and
adjust values of parameters of a filter based on an amount of the change in orientation or position of the head wearable audio device relative to the user's ear, the filter configured to adjust sound provided to the user's ear by a sound producing device in response to the change in the orientation and position data, wherein adjusting the parameters of the filter configures the filter to perform a compensation to output a target sound frequency response that accounts for the at least one change in the orientation and position of the head wearable audio device relative to the user's ear.

20. The controller of claim 19, wherein the orientation and position data comprises any one or more of:
a value of an azimuth of the sound producing device;
a value of an elevation of the sound producing device;
a value of a distance of the sound producing device;
a value of a pitch of the sound producing device;
a value of a yaw of the sound producing device; and
a roll of the sound producing device;
wherein the controller is configured to:
determine a value of an adjusted equalization variable using the value of the azimuth, the value of the elevation, the value of the distance, the value of the pitch, the value of the yaw, or the value of the roll of the sound producing device and the parameters; and
adjust the sound provided to the user's ear using the value of the adjusted equalization variable.

\* \* \* \* \*